United States Patent
Grupp et al.

(10) Patent No.: US 8,263,467 B2
(45) Date of Patent: Sep. 11, 2012

(54) PROCESS FOR FABRICATING A SELF-ALIGNED DEPOSITED SOURCE/DRAIN INSULATED GATE FIELD-EFFECT TRANSISTOR

(75) Inventors: Daniel E. Grupp, Palo Alto, CA (US);
Daniel J. Connelly, San Francisco, CA (US); Paul A. Clifton, Menlo Park, CA (US); Carl M. Faulkner, Belmont, CA (US)

(73) Assignee: Acorn Technologies, Inc., Santa Monica, CA (US)

( * ) Notice: Subject to any disclaimer, the term of this patent is extended or adjusted under 35 U.S.C. 154(b) by 7 days.

(21) Appl. No.: 13/019,789

(22) Filed: Feb. 2, 2011

(65) Prior Publication Data
US 2011/0124170 A1 May 26, 2011

Related U.S. Application Data

(60) Division of application No. 11/166,286, filed on Jun. 23, 2005, now Pat. No. 7,902,029, which is a continuation-in-part of application No. 10/217,758, filed on Aug. 12, 2002, now Pat. No. 7,084,423.

(60) Provisional application No. 60/604,868, filed on Aug. 26, 2004.

(51) Int. Cl.
*H01L 21/336* (2006.01)
(52) U.S. Cl. ....................................... 438/299
(58) Field of Classification Search .................. 438/299
See application file for complete search history.

(56) References Cited

U.S. PATENT DOCUMENTS

| | | |
|---|---|---|
| 3,590,471 A | 7/1971 | Lepselter et al. |
| 3,708,360 A | 1/1973 | Wakefield, Jr. et al. |
| 3,983,264 A | 9/1976 | Schroen et al. |
| 4,056,642 A | 11/1977 | Saxena et al. |

(Continued)

FOREIGN PATENT DOCUMENTS

EP 0295490 12/1988

(Continued)

OTHER PUBLICATIONS

Aberle, Armin G., et al., "Injection-Level Dependent Surface Recombination Velocities at The Silicon-Plasma Silicon Nitride Interface", *Institut fur Solaernergieforschung*, ISFH, D-3 1860 Emmerthal, Germany, (Mar. 9, 1995), pp. 2828-2830.

(Continued)

*Primary Examiner* — Matthew W Such
*Assistant Examiner* — Monica D Harrison
(74) *Attorney, Agent, or Firm* — Tarek N. Fahmi, APC

(57) ABSTRACT

Processes for forming self-aligned, deposited source/drain, insulated gate, transistors and, in particular, FETs. By depositing a source/drain in a recess such that it remains only in the recess, the source/drain can be formed self-aligned to a gate and/or a channel of such a device. For example, in one such process a gate structure of a transistor may be formed and, in a material surrounding the gate structure, a recess created so as to be aligned to an edge of the gate structure. Subsequently, a source/drain conducting material may be deposited in the recess. Such a source/drain conducting material may be deposited, in some cases, as layers, with one or more such layers being planarized following its deposition. In this way, the conducting material is kept within the boundaries of the recess.

37 Claims, 21 Drawing Sheets

U.S. PATENT DOCUMENTS

| | | | |
|---|---|---|---|
| 4,300,152 A | 11/1981 | Lepselter | |
| 4,485,550 A | 12/1984 | Koeneke et al. | |
| 5,021,365 A | 6/1991 | Kirchner et al. | |
| 5,399,206 A | 3/1995 | de Lyon | |
| 5,578,848 A | 11/1996 | Kwong et al. | |
| 5,596,218 A | 1/1997 | Soleimani et al. | |
| 5,612,567 A | 3/1997 | Baliga | |
| 5,663,584 A | 9/1997 | Welch | |
| 5,801,398 A | 9/1998 | Hebiguchi | |
| 5,888,891 A | 3/1999 | Gould | |
| 5,908,313 A * | 6/1999 | Chau et al. | 438/299 |
| 5,939,763 A | 8/1999 | Hao et al. | |
| 5,943,575 A | 8/1999 | Chung et al. | |
| 6,037,605 A | 3/2000 | Yoshimura | |
| 6,091,076 A | 7/2000 | Deleonibus et al. | |
| 6,096,590 A | 8/2000 | Chan et al. | |
| 6,117,781 A * | 9/2000 | Lukanc et al. | 438/692 |
| 6,150,286 A | 11/2000 | Sun et al. | |
| 6,198,113 B1 | 3/2001 | Grupp | |
| 6,207,976 B1 | 3/2001 | Takshashi et al. | |
| 6,261,932 B1 | 7/2001 | Hulfachor | |
| 6,291,866 B1 | 9/2001 | Wallace et al. | |
| 6,291,867 B1 | 9/2001 | Wallace et al. | |
| 6,303,479 B1 | 10/2001 | Snyder | |
| 6,548,875 B2 * | 4/2003 | Nishiyama | 257/377 |
| 6,958,500 B2 | 10/2005 | Saito | |
| 6,982,460 B1 | 1/2006 | Cohen et al. | |
| 7,238,985 B2 | 7/2007 | Jones et al. | |
| 2004/0142524 A1 | 7/2004 | Grupp et al. | |
| 2006/0214236 A1 | 9/2006 | Chien | |

FOREIGN PATENT DOCUMENTS

EP          0789388          8/1997

OTHER PUBLICATIONS

B. J. Zhang, et al., "Schottky Diodes of Ni/Au on n-GaN Grown on Sapphire and SiC Substrates", *Applied Physics Letters*, vol. 79, No. 16, (Oct. 15, 2001), pp. 2567-2569.

B.R. Weinberger, et al., "Surface Chemistry of HF Passivation Silicon: X-Ray Photoelectron and Lon Scattering Spectroscopy Results", *J. Appl. Phys*. 60(9), (Nov. 1, 1986), pp. 3232-3234.

Blosse, A., et al., "A Novel Low Cost 65nm CMOS Process Architecture With Self Aligned Isolation and W Cladded Source/Drain", *IEEE, Transactions of 2004 International Electron Device Meeting*, pp. 669-672.

C.L. Chen, et al., "High Quality Native-Oxide-Free Untrathin Oxide Grown by In-Situ HF-Vapor Treatment", *Electronic Letters*, vol. 36, No. 11, (May 25, 2000), pp. 981-983.

Chung-Kuang, Huang, et al., "Two-Dimensional Numerical Simulation of Schottky Barrier MOSFET with Channel Length to 10 nn", *IEEE*, pp. 842-848.

Connelly, Daniel, et al., "Optimizing Schottky S/D Offset for 25-nm Dual-Gate CMOS Performance", *IEEE Trans. Electron Devices*, vol. 47 No. 5, (2003), pp. 1028-1034.

D. J. Chadi, et al., "Fermi-Level-Pinning Defects in Highy n-Doped Silicon", *Physical Review Letters*, vol. 79, No. 24, NEC Research Institute, Princeton New Jersey 08540-6634, (Dec. 1997), pp. 4834-4837.

E. Yablonovitch, et al., "Unusually Low Surface-Recombination Velocity on Silicon and Germanium Surfaces", *Physical Review Letters*, vol. 57, No. 2, (Jul. 14, 1986), pp. 249-252.

Edelstein, D., et al., "Full Copper Wiring in a Sub-0.25 mm CMOS ULSI Technology", *Proceedings of the IEEE International Electron Device Meeting*, (Dec. 1997), pp. 773-776.

F. A. Padovani, "Forward Voltage-Current Characteristics of Metal-Silicon Schottky Barriers", *Texas Instruments, Inc.*, Dallas Texas, (Sep. 15, 1966), pp. 892-892.

G.B. Alers, et al., "Effects of Thermal Stability and Roughness on Electrical Properties of Tantalus Oxide Gates", *Mat. Res., Soc. Symp. Proc.*, vol. 567, Materials Research Society, (1999), pp. 391-395.

Gopalakrishnan, Kailash, et al., "Impact Ionization MOS (I-MOS)—Part I: Device and Circuit Simulations", *IEEE Transactions Electron Devices*, vol. 52, No. 1, (2005), pp. 69-76.

Hasegawa, Hideki, et al., "Upinning of Fermi Level in Nanometer-Sized Schottky Contacts on GaAs and InP", *Research Center for Interface Quantum Electronics and Graduate School of Electronics and Info. Eng*, Hokkaido Univ, Japan, (2000), pp. 92-96.

Heine, Volker, "Theory of Surface States", *Physical Review Letters*, vol. 138, No. 6A, Tell Telephone Lab., Murphy Jill, New Jersey, (Jun. 4, 1965).

Huang, Feng-Jung, "Metal-Oxide Semiconductor Field-Effect Transistors Using Schottky Barrier Drains", *Electronics Letters*, vol. 33, No. 15, (Jul. 17, 1997), pp. 1341-1342.

I. Shalish, et al., "Yellow Luminescence and Fermi Level Pinning in GaN Layers", *American Institute of Physics*, vol. 77, No. 7, (Aug. 14, 2000), pp. 987-989.

Internet, http://www.rciqe.hokudai.ac.jp/RCIQEold/ResearchAchievements.html, downloaded (Apr. 12, 2002).

Izumi, Hirot, et al., "43 Hydrogen Termination: The Ideally Finished Silicon Surface", *Ultraclean Surface Processing of Silicon Wafers: Secrets of Vlsi Manufacturing* http://halloftechnology.com/electrical_optical/986.shtml, (Nov. 1998).

J. Hilsenbeck, et al., "Aging Behavior of Algan HFETs With Advanced Ohmic and Schottky Contacts", *Electronic letters*, vol. 36, No. 11, (May 25, 2000), pp. 980-981.

J. Tersoff, "Schottky Barrier Heightsand The Continuum of Gap States", *Physical Review Letters*, vol. 52, No. 6, AT&T Bell Lab., Murphy Jill, New Jersey 07974, (Feb. 6, 1984).

J.R. Patel, et al., "Arsenic Atom Location on Passive Silicon (111) Surfaces", *Physical Review B*. vol. 36, No. 14, (Nov. 15, 1987), pp. 7715-7717.

K. Nauka, et al., "Surface Photovoltage Measurement of Hydrogen-Tteated Si Surfaces", *Journal of Electrochemical Society* 146(1), (1999), pp. 292-295.

Kamiyama, Satoshi, et al., "Ultrathin Tantalum Odise Capacitor Dielectric Layers Fabricated Using Rapid Thermal Nitridation Prior to Low Pressure Chemical Vapor Deposition", *j. Electrochem Soc.*, vol. 140, No. 6, The Electrochemical Society, Inc., (Jun. 6, 1993), pp. 1617.

Kedzierski, Jakub, et al., "Extension and Source/Drain Design for High-Performance FinFET Devices", *IEEE Trans. Electron Devices*, vol. 50, No. 4, (Apr. 2003), pp. 952-958.

Kimura, Mitsuteru, et al., "A New Type of Schottky Tunnel Transistor", *IEEE Electron Device Letters*, vol. 15, No. 10, (Oct. 1994), pp. 412-414.

L. Cai, et al., "Investigation of the Properties of Plasma-Enhanced Chemical Vapor Deposition Silicon Nitride and its Effect on Silicon Surface Passivation", *Journal of Applied Physics*, vol. 83, No. 11, (Jun. 1, 1998), pp. 5885-5889.

Lee, Takhee, et al., "Electronic Property of Metallic Nanoclusters on Semiconductor Surfaces: Implications for Nanoelectronic Device Applications", *Journal of Nanoparticle Research 2*, (2000), pp. 345-362.

Louie, Steven G., et al., "Ionicity and the Theory of Schottky Barriers", *Physical Review Letters*, vol. 15, No. 4, Dept. of Phys. Univ. of California, and Materials Research Div., Lawrence Berjley Lab., Berkley, CA 94720.

M. A. Sobolewski, et al., "Properties of Ultrathin Thermal Nitrides in Silicon Schottky Barrier Structures", *Applied Physics Letters, American Institute of Physics*, vol. 54, No. 7, (Feb. 13, 1989), pp. 638-640.

M. Miyawaki, et al., "Improvement of Aluminum-Si Contact Performance in Native-Oxide-Free Processing", *IEEE Electron Device Letters*, vol. 11, No. 10, (Oct. 1990), pp. 448-450.

M.C. Gilmer, et al., "Process and Manufacturing Challenges for High-K Gate Stack Systems", *Mat. Res. Soc. Symp. Proc.* vol. 567, (1999), pp. 323-341.

Mandelis, Andreas, et al., "Evidence of a Surface Acceptor State in Undoped Semi-Insulating GaAs by Photothermal Radiometric Deep Level Transient Spectroscopy", *Sociedad Mexiacana de Ciencias de Superficies y de Vacio*, (1999), pp. 13-17.

Nishioka, Yasushiro, et al., "Dielectric Characteristics of Forinated Ultradry SiO2", *Appl. Phy. Letters* 54(12), (Mar. 20, 1989), pp. 1127-1129.

Okamoto, Naoya, et al., "Near-Ohmic Contact of n-GaAs with Ga/Ga/GaAs Quaisi-Metal-Insulator-Semiconductor Structure", *Jpn. J. Appl. Phys.*, vol. 37, (1998), pp. 32483251.

P. Bauernschmitt, et al., "Yb-SiO2-Si Tunneling Junctions", *Elsevier Publishers B.V.*, (1993), pp. 105-108.

Porter, Lisa M., et al., "A Critical Review of Ohmic and Rectifying Contacts for Silicon Carbide", *Material Science and Engineering*, vol. 34, No. 2, (Nov. 1, 1995), pp. 83-105.

R.A. McKee, et al., "Physical Structure and Inversion Chargeat a Semiconductor Interface with a Crystalline Oxide", www.sciencemag.org, vol. 293, (Jul. 20, 2001), pp. 468-469.

R.D. Bringans, "Arsenic Passivation of Si and Ge Surfaces", *Critical Reviews in Solid State and Materials Sciences*, vol. 17(4): 353-395, (1992), pp. 353-395.

R.M.C. De Almeida, et al., "Reaction-Diffusion Model for Thermal Growth of Silicon Nitrite Films on Si", *Physical Review B*, vol. 62, No. 24, (12/1500), pp. R16 255-R16 258.

R.T. Tung, "Electron Transport of Inhomogeneous Schottky Barriers", *AT&T Bell Lab.*, Murray Hill, New Jsery 07974, (Mar. 21, 1991), pp. 3832-3834.

S. Hara, et al., "Control of Schottky and Ohmic Interfaces by Unpinning Fermi Level", *Elsevier Science B.V.*, pp. 394-399.

S. Hara, et al., "Pinning-Controlled Metal/Semiconductor Interfaces", *Electrotechnical Laboratory*, pp. 802-807.

S. Hara, et al., "Pinning-Controlled Ohmic Contacts: Application to SiC(0001)", *Elsevier Science B.V.*, pp. 218-221.

S. Verhaverbeke, et al., "Surface Characterization of Si After HF Treatments and its Influence in the Dielectric Breakdown of Thermal Oxides", *Research Aspirant of the Belgium National Fund for Scientific Research; Mat. Res. Soc. Symp. Proc.*, vol. 259, Material Research Socity, (1992), pp. 391-399.

S.A. Wolf, et al., "Spintronics: A Spin-Based Vision for the Future", www.sciencemag.or, vol. 294, (Nov. 6, 2001), pp. 1488.

S.M. Sze, "Metal-Semiconductor Contacts", *Physics of Semiconductor Devices, John Wiley & Sons*, (1981).

Schmidt, Jan, et al., "Carrier Recombination at Silicon-Silicon Nitride Interfaces Fabricated by Plasma-Enhanced Chemical Vapor Deposition", *Journal of Applied Physics*, vol. 85, No. 7, (Apr. 1, 1999), pp. 3626-3633.

Search Report, "International Searching Authority", PCT/US03/25054, (Dec. 3, 2003), pp. 8.

Shaik, Lahir, et al., "Experimental Identification of Nitrogen-Vacancy Complexes in Nitrogen Implated Silicon", *Applied Physics Letters*, vol. 79, No. 5, (Jul. 30, 2001), pp. 623-625.

Snyder, John P., et al., "Experimental Investigation of a PtSi Source and Drain Field Emission Transister", *American Institute of Physics*, pp. 1-3.

T.I. Kamins, et al., "Effect of Hydrogen on p-Type Epitaxial Silicon Sheet-Resistance Measurements", *Electrochemical and Solid-State Letters* 1(2), (1998), pp. 100-101.

Teraji, Tokuyuki, et al., "Ohmic Contacts to n-Type 6H-SiC Without Post-Annealing", *Material Research Society Symposium Proceeding*, (Apr. 8, 1996), pp. 149-154.

Thompson, Scott E., et al., "A Logic Nanotechnology Featuring Strained-Silicon", *IEEE Electron Device Letters*, vol. 25, No. 4, (2004), pp. 191-193.

U.J.R. Baumvol, "Atomic Transport During Growth of Ultrathin Dielectronics on Silicon", *Surface Science Reports 36*, (1999), pp. 1-166.

W.E. Spicer, et al., "Unified Mechanism for Schottky-Barrier Formation and III-V Oxide Interface States", *Physical Review Letters*, vol. 44, No. 6, Stanford Electronics Lab., Stanford Univ., Stanford, CA 94305, (Feb. 11, 1980), pp. 420-423.

Wang, Lie, et al., "High Barrier GaN Schottky Diodes: Pt/GaN and Pd/GaN", *Dept. of Electrical Eng.*, Univ. of Minnesota, Minneapolis, Minneasota 55455; Appl. Phys. Letters, vol. 68(9), (Feb. 26, 1996), pp. 1267-1270.

Wei, C.S, et al., "The Use of Selective Electroless Metal Deposition for Micron Size Contact Fill", *IEEE TInternational Electron Device Meeting Technical Digest*, (1988), pp. 446-449.

Widjaja, Yuniarto, et al., "Ab Initlo Study and Decomposition of NH3 on Si(100)-(2×1)", *J. Phy. Chem B*, (2000), pp. 2527-2533.

Wright, Peter J., et al., "Hot-Electron Immunity of SiO2 Dielectrics with Fluorine Incorporation", *IEEE Electron Device Letters*, vol. 10, No. 8, (Aug. 8, 1989), pp. 347-348.

Y. Hayafuji, et al., "Nitridation of Silicon and Oxidized-Silicon", *Sony Corp. Research Center*, 174 Fujitsuka-Cho, Hodogaya-Ku, Yokohama, 240 Japan; J. Electrochem. Soc.: Solid State Science and Technology, (Sep. 1982).

Y. K. Kim, et al., "Metal-Dependent Fermi-Level Movement in the Metal/Sulfer-Passivated InGaP Contact", *J. Vac Sci. Technology A* 15(3), (1997), pp. 1124-1128.

Yagishita, Atsushi, et al., "High Performance Damascene Metal Gate MOSFET's for 0.1 μm Regime", *IEEE Trans. Electron Devices*, vol. 47, No. 5, (2000), pp. 1028-1034.

Yang, Hanyang, et al., "The Effects of Interfacial Sub-Oxide Transition Regions and Monolayer Level Nitridation on Tunneling Currents in Silicon Devices", *IEEE Electron Device Letters*, vol. 21, No. 2, (Feb. 2, 2000), pp. 76-78.

Acorn Technologies, Inc.; PCT/US2005/030209 filed Aug. 24, 2005; International Search Report and Written Opinion; ISA/EP; mailed Mar. 2, 2006, 8pp.

* cited by examiner

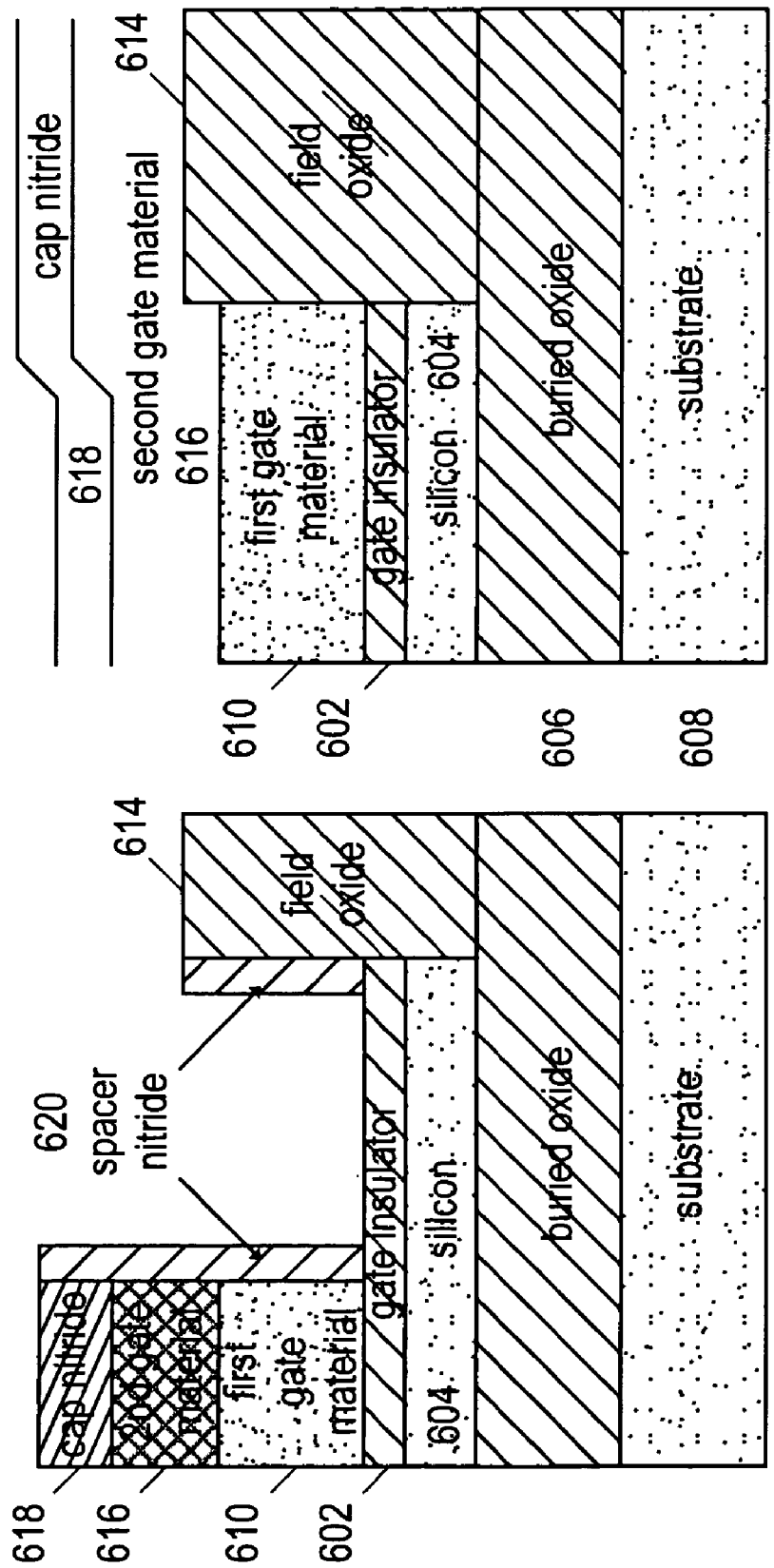

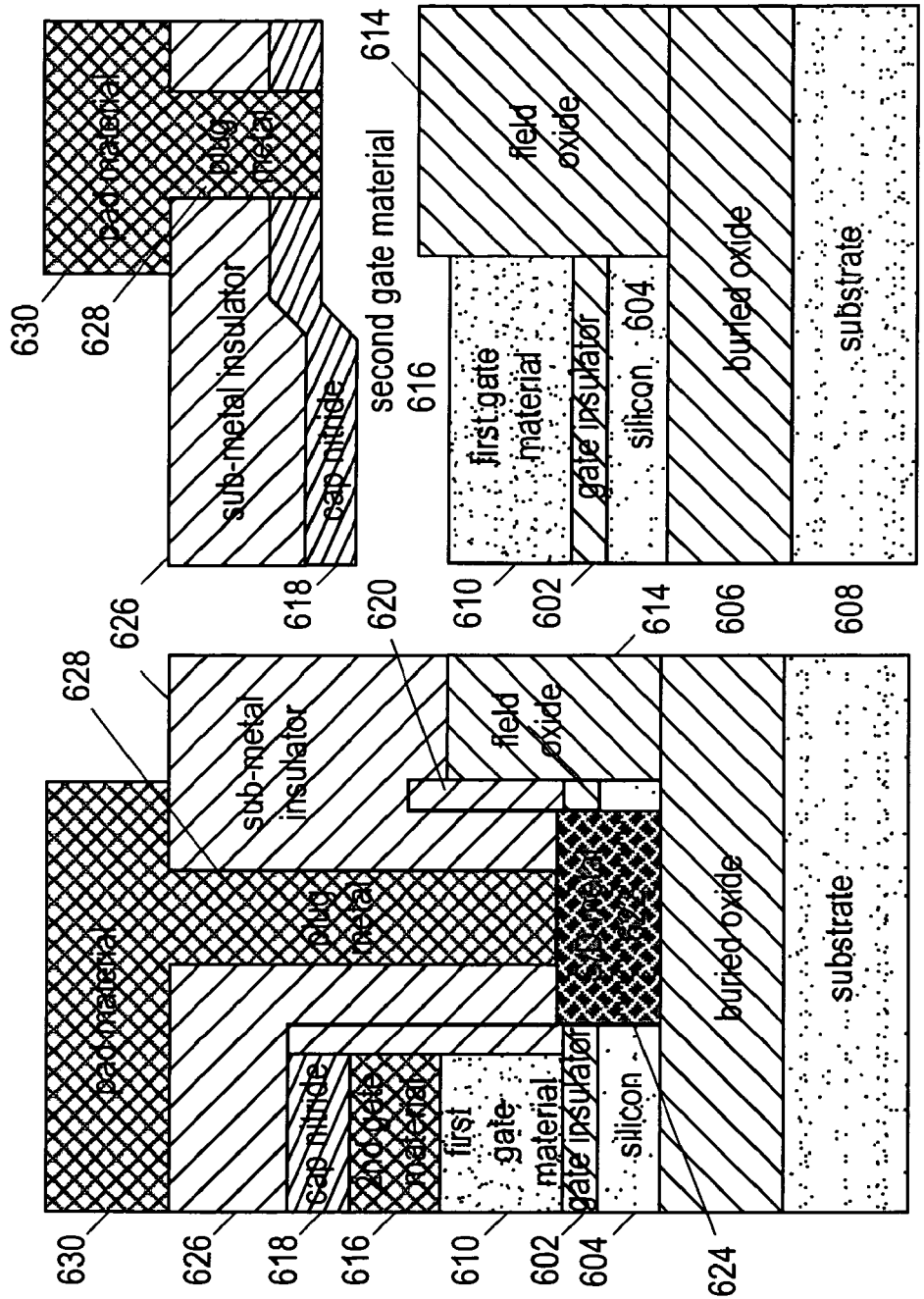

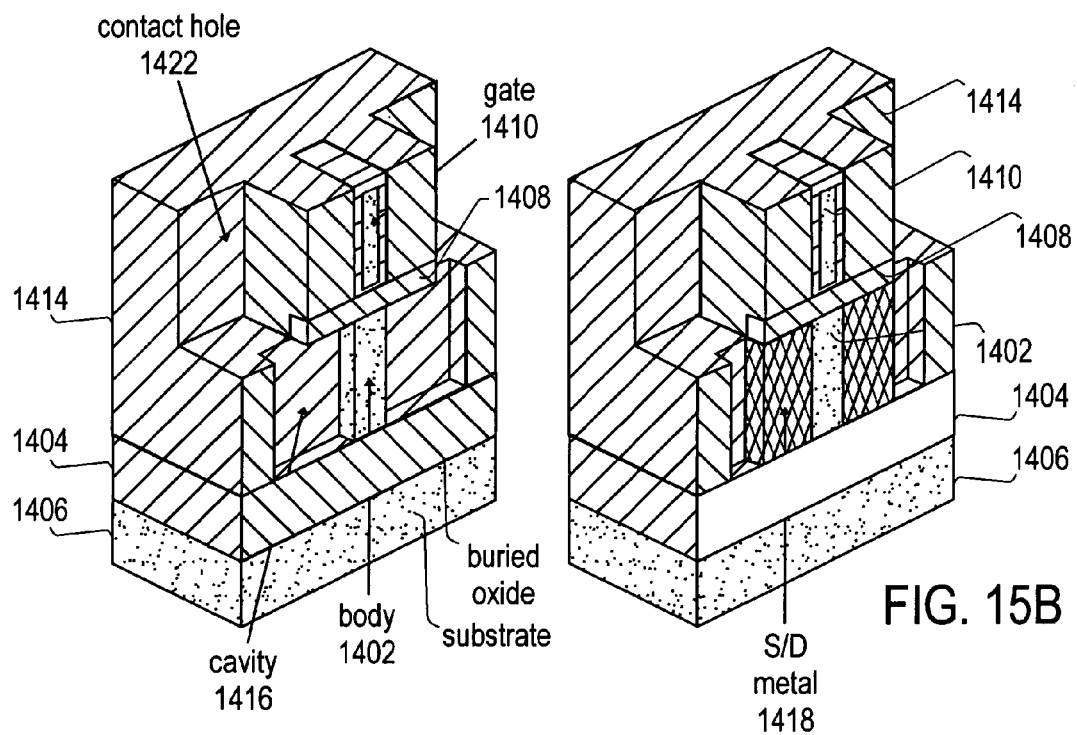
FIG. 15A
FIG. 15B
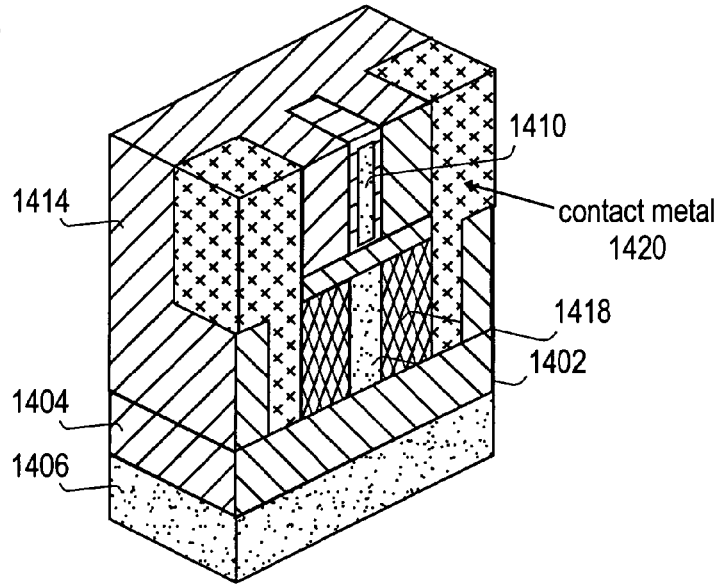
FIG. 15C

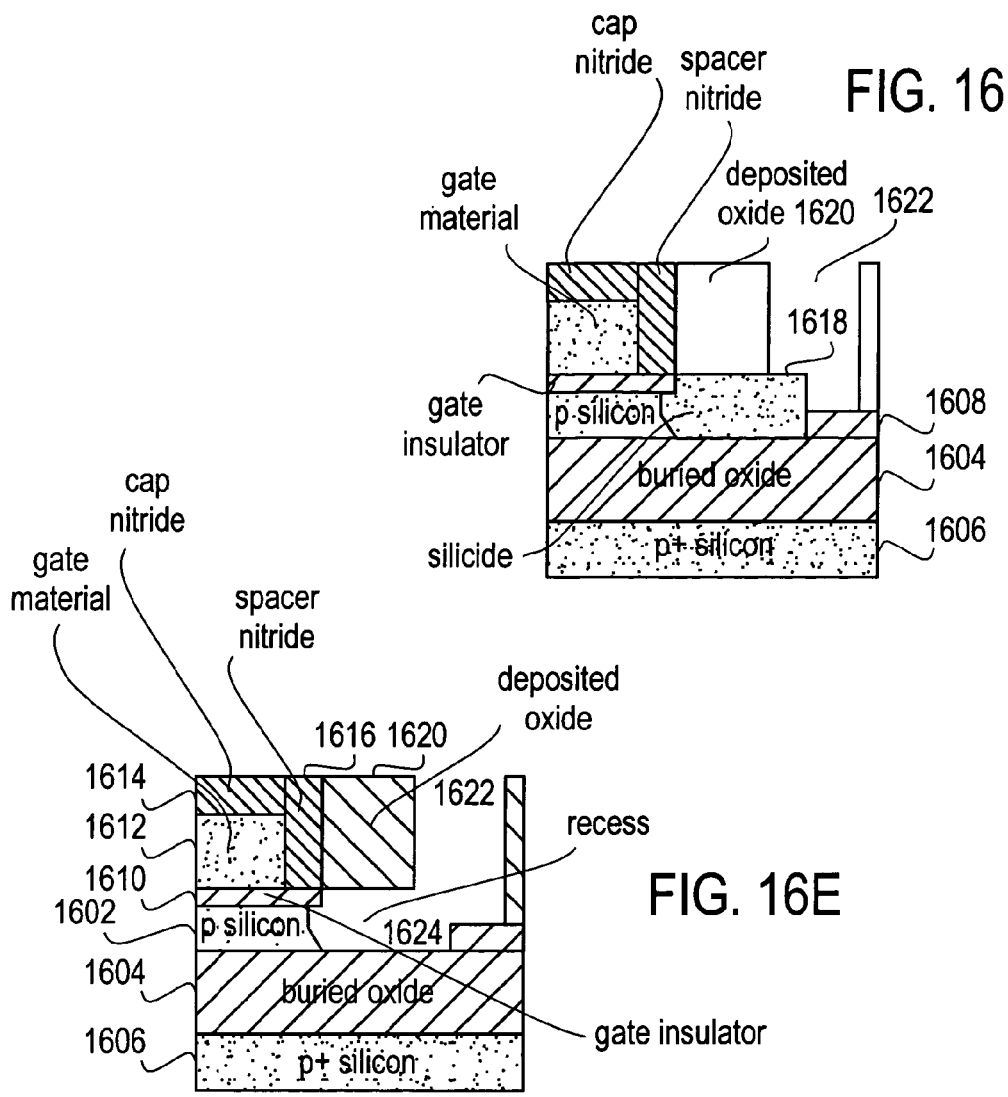

PROCESS FOR FABRICATING A SELF-ALIGNED DEPOSITED SOURCE/DRAIN INSULATED GATE FIELD-EFFECT TRANSISTOR

RELATED APPLICATIONS

The present application is a DIVISIONAL of U.S. patent application Ser. No. 11/166,286, filed Jun. 23, 2005 now U.S. Pat. No. 7,902,029; which is (i) a CONTINUATION-IN-PART of U.S. patent application Ser. No. 10/217,758, filed Aug. 12, 2002, now U.S. Pat. No. 7,084,423, and (ii) is a non-provisional of and claims priority to U.S. Provisional Application 60/604,868, filed Aug. 26, 2004, each of which is assigned to the assignee of the present invention and incorporated herein by reference.

FIELD OF THE INVENTION

The present invention relates to processes for forming self-aligned, deposited source/drain, insulated gate, field-effect transistors (FETs).

BACKGROUND

In order to minimize the switching delay of a transistor, subject to other constraints such as power consumption, it is critical to minimize the degree of misalignment between the transistor's source/drain region(s) and the channel(s) to which they are connected. Along the axis perpendicular to the boundary between a source/drain and a channel (the "length axis"), if a source region is separated from the channel by an excessive distance (typically up to approximately 10 nm in silicon-based high-speed technology), the resistance between the source region and the channel limits the current carrying capacity of the transistor for typical "on-state" terminal biases. On the other hand, if the separation is reduced such that the source region overlaps the gate associated with the channel, then for excessive source-to-gate overlap the capacitance between the source and the gate will limit the speed at which circuits using the transistor can be operated.

Along the direction parallel to the boundary between the source and the channel (the "width axis"), if the edge of the channel extends beyond the edge of the source region, such that some of the channel edge is not contacted by the source, then the resistance between the source and the channel is increased relative to the case in which the source is aligned with the edge of the channel. On the other hand, if the edge of the source extends beyond the edge of the channel, such that not all of the source edge is in contact with channel, then the capacitance associated with the source is increased relative to the case in which the source edge is aligned with the channel edge. This case also results in reduced switching speeds relative to the case of a well-aligned edge. Thus, proper alignment along both the width and length axes is critical to optimizing the design of transistors, and in particular metal oxide semiconductor field-effect transistors (MOSFETs).

Alignment between regions in a semiconductor process can generally be achieved in two ways. One is for the layers of materials that will eventually make up the device to be independently patterned, aligned either manually or via automated alignment systems. For example, a first region of the device can be patterned, yielding "alignment marks" which can then be used in subsequent patterning processes as a reference. That is, a mask used to pattern a subsequent region of the device can be oriented relative to the alignment mark(s) left by the first patterning operation such that, within tolerances characteristic of the alignment and patterning process being used, the local degrees of freedom (for example, in-plane length-axis position, in-plane width-axis position, rotation, length-axis scale factor, width-axis scale factor, and shear) between the two patterns is constrained. The key is that each of these degrees of freedom is constrained only to within tolerances associated with the alignment and pattern transfer processes; so, as the characteristic dimensions of transistors is reduced over time, these tolerances must meet an increasingly restrictive standard. Other alignment strategies involve aligning each of two layers to alignment marks formed from an earlier patterning step; however, in each case the alignment tolerances remain a limiting factor.

A preferable approach is a "self-aligned" process wherein the relative orientation and/or position of two or more regions or boundaries is constrained as a natural consequence of the fabrication process, and not the explicit positioning or orienting of masks or other pattern transfer mechanisms. This eliminates the variation associated with the alignment of masks. Instead, on-wafer features or chemistry, for example, are used to constrain the formation of or the character of material in regions of the device under fabrication. Several self-aligned processes presently exist in the art:

A. Self-Alignment via Ion Implantation

Today, MOSFETs are often fabricated using impurities of silicon, for example Ar (for n-type) and/or B (for p-type), to form conducting source/drain regions. Typically the gate is patterned on a gate insulator in the channel region(s), with a thick "field oxide" in "field" region(s). In source and drain region(s), the silicon is capped only with a thin layer of $SiO_2$, for example. Then, an energetic beam of ions of the desired impurity is directed, typically within approximately 30 degrees of perpendicular, onto the wafer surface.

Where the ion beam impacts the gate material (possibly in combination with additional layers self-aligned thereto), the impurities are essentially blocked from penetrating into the silicon in the channel region(s). Likewise, in the field region(s) the thick field oxide blocks the impurities from entering any underlying silicon. In the source/drain region(s), however, the impurities penetrate the thin $SiO_2$ layer and penetrate the underlying silicon. Following a suitable anneal to increase the fraction of substitutional, electrically active impurities, the source and drain region(s) are then made to be conducting. As the implant is naturally blocked from creating impurities in the silicon of the field and the channel region(s), the process is self-aligned.

There are alternate methods of introducing impurities into the silicon besides ion implantation. For example, a material containing a high concentration of the desired impurity can be deposited on the wafer surface. Where the silicon is exposed, or protected only with suitably thin and/or permeable materials, an appropriate thermal cycle can be employed to diffuse the impurity from the deposited layer into the silicon. The impurity-rich material can then be selectively removed from the surface, leaving impurity-rich silicon in the source/drain regions. Note, this approach does not generally constitute a "deposited source/drain" as that term is used in the context of the present invention described below, because, for example, the impurities are intentionally removed from the deposited material, displaced into the source/drain material (e.g., by diffusion facilitated by an anneal at elevated temperature), and the remaining deposited material subsequently removed. Thus, the deposited material is not itself the source/drain of the device.

Whether created by ion implantation or otherwise, however, a limitation of impurity-rich semiconductors, for example doped silicon, is that such devices exhibit low conductivity relative to metals. Stated differently, metals offer the promise of lower resistance source/drains. Additionally, with many semiconductors other than silicon, lower concentrations of "electrically active" impurities (substitutional impurities that contribute to the concentration of mobile electrons or holes) than those available with silicon are achievable. An example is n-type Ge. Further, the interface between impurity-rich and impurity-poor semiconductor is difficult to control to atom resolution, whereas metal/semiconductor interfaces are essentially atomically abrupt. Lack of abruptness and control each limit the precision with which the alignment between the source/drain and the gate and/or channel can be obtained. Further, these failings can contribute to "short channel" effects that degrade the control of the channel conductivity by the gate.

B. Self-Alignment via Chemical Reaction

Another approach to self-alignment is via a chemical reaction with exposed material. For example, assume an exposed silicon surface remains in the source/drain region, but the field region is protected by thick oxide, and the gate is completely protected by reaction-resistant layers, such as $SiO_2$ and/or $Si_3N_4$. If a metal that reacts with Si, for example Pt, is then deposited on the exposed silicon surfaces, and the wafer is heated to a temperature sufficient to cause a reaction with that silicon, the reaction product can be formed only in the source/drain regions. Removal of the unreacted metal leaves a conductor (for example, PtSi) only in the source/drain regions, self-aligned along both the length axis (to the edge of the gate) and along the width axis (to the edge of the field oxide).

Although in the above example the metal is deposited, this approach does not generally constitute a "deposited source/drain" as that term is used in the context of the present invention. Instead, in this example the source/drain comprises the reacted material, not the reagent, and it is only reagents that are deposited. Stated differently, the source/drain is formed in the same material that forms the channel, not as the direct consequence of the deposition.

An issue with source/drain formation by chemical reaction is that it limits the range of materials that can be used for the source/drain conductor. Metal silicides, for example, result in a Schottky barrier to the silicon channel that limits the effective on-state conductance of the junction. An approach to reducing this resistance is to arrange for the silicidation reaction to consume sufficient silicon that the edge of the source(s) and possibly drain(s) extends under the gate. See, for example, U.S. Pat. No. 6,744,103 of Snyder, "Short-channel Schottky-Barrier MOSFET Device and Manufacturing Method". As has been discussed above, however, this leads to increased gate-to-source, and possibly gate-to-drain, capacitance and also results in more severe "short-channel effects" than is the case for aligned source/drain—channel interfaces.

An approach to reduce these short-channel effects is disclosed in U.S. Pat. No. 6,509,609 of Zhang, et al., "Grooved Channel Schottky MOSFET", wherein the gate is recessed in the semiconductor, yielding a U-shaped channel. Problems remain with this approach, however, including high gate-to-source and gate-to-drain capacitance, gate insulator integrity across the corner of the trench, increased local channel resistance due to a concave surface and the resulting electric field divergence from the gate, and high leakage current at negative gate-to-source biases. A preferred approach, as advanced by several of the present inventors in the above-cited co-pending U.S. patent application Ser. No. 10/217,758, is to reduce the height of the Schottky barrier between the channel and the source(s), for which the availability of a broader range of source/drain material options is advantageous.

C. Self-Alignment via Damascene Metal

An approach to using surface topography to form self-aligned metal layers is the "damascene process", wherein metal is deposited in a recess and then "planarized", for example via polishing, to remove excess material above the plane of the top of the recess. The result is metal remaining only in the recess. This technique has been used for the patterning of copper interconnects in $SiO_2$, see, e.g., D. Edelstein et al., *Full Copper Wiring in a Sub-0.25 µm CMOS ULSI Technology*, Proceedings of the IEEE International Electron Device Meeting, pp. 773-776 (December 1997), and to form gate electrodes, see, e.g., A. Yagashita, et al., *High performance damascene metal gate MOSFETs for 0.1 µm regime*, IEEE Trans. Electron Devices, v. 47 n. 5, pp. 1028-1034 (2000).

FIGS. 1a-1f, reproduced from the Yagashita reference, illustrate the basics of the damascene process including the use of a "sacrificial gate". As shown in FIG. 1a, a stack of a dummy gate oxide 10, a sacrificial polycrystalline Si gate 12, and a $Si_3N_4$ cap 14 is formed on a wafer 16 on which shallow trench isolation has been used to form the field oxide. The gate pattern is then transferred to the polycrystalline Si—$Si_3N_4$ stack using a photoresist mask 18. Referring to FIG. 1b, sidewall spacers 20 are then formed on the patterned gate stack and ion implantation then forms self-aligned source/drain regions 22/24. Referring to FIG. 1c, a thick $SiO_2$ layer 26 is then deposited and planarized (e.g., by chemical mechanical polishing (CMP)) to the level of the $Si_3N_4$ cap 18 on the sacrificial gate. As shown in FIG. 1d, the $Si_3N_4$ cap 18, sacrificial gate 14, and the underlying "dummy" gate oxide 16 are then removed. Referring to FIG. 1e, a fresh gate insulator 28, for example $SiO_2$ and/or a deposited metal oxide (e.g., TiN) 30, is then formed in the recess, followed immediately by the deposition of a metal gate (e.g., Al or W) 32. As shown in FIG. 1f, this gate metal 32 is subsequently planarized (e.g., via CMP) to the level of the previously planarized $SiO_2$ layer 26, yielding a metal gate 34 self-aligned to the source/drain regions 22/24.

Another example, reported in U.S. Pat. No. 6,686,231, "Damascene Gate Process with Sacrificial Oxide in Semiconductor Devices", discloses a damascene replacement gate process. In replacement gate processes, at least part of the recess for the damascene process results from removal of a sacrificial layer. Like the process described by Yagashita, however, this process does not provide for metal source/drain regions.

A process that provides metal source/drain contacts and a damascene-like metal gate is disclosed in U.S. Pat. No. 4,889,827, "Method for the Manufacture of a MESFET Comprising Self Aligned Gate", and the results of that process are shown in FIG. 2 (which is adapted from the '827 patent). As shown, a first metal layer 36 is formed and capped with an insulator 38. A recess is patterned in these layers, sidewall spacers 40 and 42 are formed in therein, and then a second metal layer 44 for the gate is deposited between the spacers.

A primary disadvantage of this approach, were it to be applied to MOSFETs, is that the gate stack is processed subsequent to the source/drain. It is typical in the processing of MOSFETs that elevated temperatures are required to produce high-quality gate insulators. Consequently, the process sequence reported in the '827 patent would require that the source/drain stack be tolerant of the process conditions used for the gate stack, potentially a serious disadvantage. It is perhaps not surprising then that the '827 patent describes the damascene process only as it relates to MESFETs, wherein the "source"—the region which supplies carriers to the channel—is not the metal contact 36, but rather the doped region 46 in the vicinity of the channel region 48. In contrast, for a typical MOSFET, where the channel is formed in an inversion layer (or an accumulation layer in a region of otherwise insignificant concentration of carriers of the type in the channel), in the absence of a region doped with a high concentration of donors (n-channel FET) or acceptors (p-channel FET) to match the charge in the channel, a metal contact in the vicinity of the channel acts as a source directly.

Also, it is worth noting that the source/drain of the device shown in the '827 patent is not formed in a recess. As discussed above, the use of the recess allows the source/drain to be self-aligned relative to previously formed features. The '827 patent, on the other hand, describes the alignment features subsequent to the formation of the source/drains and fails to allow for width-axis alignment of the source/drain and the gate.

Finally, damascene contacts to sources/drains have been reported. For example, and with reference to FIGS. 3a and 3b, U.S. Pat. No. 4,713,356 of Hiruta, "Manufacturing MOS semiconductor device with planarized conductive layer", describes how "source and drain regions" are "formed in a semiconductor substrate" using a gate layer as a mask. A conductive layer is then deposited and "etched back" to expose "the upper surface" of the gate electrode and the "top surface" of an insulating film (typically, the field oxide), yet leaving conducting material "on" the "source and drain regions". This process, while it forms contacts to the source/drain regions via a deposition and damascene process, fails to form the actual source/drain in this fashion. Indeed, the '356 patent describes how "an n-type impurity is then ion-implanted in a substrate 50 using electrode 52 as a mask to form $n^+$-type source and drain regions 54 and 56".

Damascene contacts to a source/drain fundamentally differ from an actual damascene source/drain in several ways:

1. The implants forming source/drain regions 54 and 56 must be omitted if the conductors 58a and 58b are to function as the source/drain.
2. The spacer 60 must be severely limited in length to allow carriers to travel between the channel region 62 and the conductors 58a and 58b.
3. The interface between the conductors 58a and 58b, and the substrate 50, specifically near the channel region 62, should preferably be angled relative to the channel, as opposed to coplanar relative to the channel, to reduce the mean path length required for carriers to travel between the interface and the channel.

If the implantation, or other means, of forming the source/drain regions 54 and 56 is omitted without constraining the length of spacer 60 on at least the source side, and perhaps also the drain side, the device resistance will be excessive due to the need for the current to flow through a region of relatively low electron (n-channel FET) or hole (p-channel FET) concentration. With the implant, the spacer length is substantially less constrained, as the source/drain region generally has relatively high conductivity, and thus resistance between the edge of the channel and the source/drain contacts 58a and 58b is relatively small. The key difference is that with damascene contacts to a source/drain, the electrons (n-channel FET) or holes (p-channel FET) for the channel are provided by a source other than the damascene conductor, e.g., an $n^+$-implanted region in the example of the '356 patent. This requires near proximity of the source to the channel, and of the contact to the source, but not of the contact to the channel.

Hiruta offers no suggestion as to how or even if the processes described in the '356 patent could be extended to an actual damascene source/drain. For example, the process discussed in the '356 patent includes no etch of the semiconductor in the source/drain region, and therefore fails to account for source-to-gate overlap. This is perhaps not surprising as, to date, silicon device technologies designed for low transistor resistance in the "on" state have been designed with source-to-gate overlap (see, e.g., the '356 patent). This is also true with metal source/drains (see, e.g., the '103 patent cited above). The present inventors have, however, shown that for short-channel transistors with a low Schottky barrier, overlap of the source and gate is detrimental to switching speed. See D. Connelly et al., *Optimizing Schottky S/D offset for 25-nm dual-gate CMOS performance*, IEEE Electron Device Letters, v. 24, n. 6, pp. 411-413 (2003).

In addition to the above concern, the '356 patent places no limitation on the length of the gate spacers, a critical parameter for the optimization of deposited source/drain MOSFETs without source-to-gate overlap. Nor does the '356 patent offer guidance for extending the gate electrode over the field region. Because gates are typically designed with length-axis dimensions nearly as short as can be reliably defined in a technology, aligning a contact to the gate over the channel is impractical without locally lengthening the channel, which would yield a large capacitance penalty. Instead, the gate electrode is typically extended over the field, a region where the per-area capacitance is reduced, for example due to the presence of a thick insulator, for contact to one or more subsequent metal layers.

For at least these reasons then, the process described in the '356 patent is not suitable for forming self-aligned, deposited source/drain, insulated gate FETs, and so an alternative procedure is needed.

SUMMARY OF THE INVENTION

Embodiments of the present invention provide processes for forming self-aligned, deposited source/drain, insulated gate, transistors and, in particular, FETs. For example, in one such process a gate structure of a transistor may be formed and, in a material surrounding the gate structure, a recess created so as to be aligned to an edge of the gate structure. Subsequently, a source/drain conducting material may be deposited in the recess. Such a source/drain conducting material may be deposited, in some cases, as layers, with one or more, perhaps each such layer being planarized following its deposition. In this way, the conducting material is kept within the boundaries of the recess.

Alternatively, or in addition, the conducting material may be deposited in the recess via selective deposition, selective electrolytic deposition, or autocatalytic deposition within the recess. In some cases, prior to the deposition of the conducting material, one or more passivation layers may be selectively deposited within the recess. Or, prior to depositing the source/drain conducting material, one or more additional materials may be first deposited in the recess (e.g., via selective electrolytic deposition) and then anodized to form a passivation layer. Following such anodization of the one or more additional materials, the source/drain conducting material may then be deposited (e.g., by further selective electrolytic deposition). In still further examples, the source/drain conducting material may be deposited in combination with one or more non-conducting materials.

In some embodiments, the recess into which the source/drain material is deposited is self-aligned to the edge of the gate structure and/or with an edge of a channel of the transistor at a border with a field region. The gate structure itself may be formed by depositing a conductor in an additional recess formed in the material surrounding the gate structure.

In some cases, the gate structure is formed, at least in part, from a material stack that includes a union of one or more source and/or drain regions and the channel. Such a material stack may contain one or more insulating materials. Boundaries of the material stack from which the gate structure (and, possibly, the field region) is formed may themselves be formed in a common pattern transfer process. Also, the material stack may be used as a template for forming the field region.

In still further embodiments, semiconductor material is removed from the field region, leaving an opening therein, and subsequently that opening is filled with insulating material(s) using a process configured so as to leave an insulator in the field region of a height approximately equal to that of the material stack from which the gate structure is formed. Such a process may include filling the opening to beyond the height of the material stack and, subsequently, planarizing the insulating material(s) to approximately the height of the material stack.

In some examples of the present invention the gate structure is made up of a multilayer of independently patterned material stacks, including a first material stack that includes a union of one or more source and/or drain regions and the channel, and a second material stack, and the channel is defined by a region of overlap of the two independently patterned material stacks. The first and second material stacks may be conducting and electrically coupled with one another, and an electrical contact to the gate structure may be formed via the second material stack in a region not overlapping the channel. In some cases the second material stack is formed of one or more materials that are resistant to an etch process used to pattern the first and second material stacks. For example, an etch process configured such that the first material stack remains only in a vicinity of the channel. The channel of the transistor may be formed only in a region approximately coincident with remaining portions of the first material stack. Alternatively, the first material stack may be etched from regions not protected, directly or indirectly, by the second material stack. Or, the first material stack may be patterned using a patterning step which defines the second material stack.

In some embodiments of the present invention the recess is formed, at least in part, in a first material stack which corresponds to one or more active areas. That first material stack may be used to protect an active area of the transistor from an isolation process that inhibits conduction in a field region of the transistor. Such an isolation process may include removal of semiconductor from the field region to form a void, and subsequent filling of the void with a second material stack to approximately a same height as the first material stack. That second material stack may include a layer resistant to an etch used in the isolation process. Further, the filling of the void may include depositing or growing the second material stack followed by planarization thereof.

The gate structure discussed above may be formed in the additional recess by forming one or more conducting layers and sequentially or singly removing portions of those conducting layers where they extend beyond boundaries of the additional recess using a planarization process. For its part, the source/drain recess may by formed by first exposing source/drain material to a process which sensitizes the source/drain material to a subsequent etch, covering at least a portion of the source/drain material with an insulator, removing exposed portions of the source/drain material to create a cavity, and filling the cavity with the source/drain conducting material. The exposed portions of the source/drain material may be exposed by etching a hole through the insulator. The source/drain conducting material may be first deposited such that it essentially fully covers a surface inside the cavity, then etched from regions outside the cavity.

Sensitizing the source/drain material is may be by chemical reaction, by reaction with a metal (e.g., followed by subsequent removal of unreacted metal, leaving behind a reaction product in source/drain regions of the transistor), by incorporation of ionized impurities (e.g., so that an etch sensitive to concentrations of the ionized impurities will preferentially remove the source/drain material into which the ionized impurities are incorporated), by incorporation of another material to form an alloy (e.g., so an etch preferentially removes the alloy), or by an electrochemical process. Alternatively, the source/drain material may be made to be porous, and an etch that preferentially removes porous material used. Finally, if the source/drain material has a crystalline structure, which structure can be disrupted by exposure of the source/drain material to bombardment with energetic ions, then following such exposure an etch that preferentially removes material of disrupted crystalline structure may be employed.

BRIEF DESCRIPTION OF THE DRAWINGS

The present invention is illustrated by way of example, and not limitation, in the figures of the accompanying drawings in which:

FIGS. 7a-7b illustrate the length and width axes cut away views, respectively, of the self-aligned mesa transistor at further stages of fabrication in accordance with an embodiment of the present invention;

FIGS. 9a-9b illustrate the length and width axes cut away views, respectively, of the self-aligned mesa transistor at yet further stages of fabrication in accordance with an embodiment of the present invention;

FIGS. 15a-15c illustrate additional views of the FinFET fabrication process further stages thereof in accordance with an embodiment of the present invention;

FIGS. 16a-16f illustrate various views of the fabrication of a planar FET with a sacrificial source/drain in accordance with an embodiment of the present invention;

DETAILED DESCRIPTION

Introduction and Self-Aligned Processes

Described below are processes for forming self-aligned, deposited source/drain, insulated gate, transistors and, in particular, FETs. The present inventors have determined that by depositing a source/drain in a recess (e.g., a recess self-aligned to the gate of the subject device) such that it remains only in the recess, the source/drain can be formed self-aligned to a channel of such a device. In preferred embodiments of the present invention the recess is self-aligned to the edge of the channel at its interface with a field region. Herein the inventors describe several alternatives for constructing transistors in accordance with this invention, however, it should be remembered that these examples are intended only as such and that the full scope of the present invention should only be measured in terms of the claims following this description.

As discussed above, while self-alignment via ion implantation is an established technique for transistor fabrication, limitations of source/drains constructed in that fashion make self-aligned, deposited source/drains desirable. Further, deposited source/drains, perhaps in conjunction with interfacial passivation layers, offer increased opportunities for source/drain engineering. The use of such passivation layers was explained in detail in the present inventors' U.S. Published Patent Application 2004/0026687, "Method for depinning the Fermi level of a semiconductor at an electrical junction and devices incorporating such junctions", cited above. Hence, source/drain regions may be formed by depositing a suitable metal (e.g., Yb or Mg) on the silicon wafer using a thin passivation layer (e.g., $Si_3N_4$) to reduce the degree of metal/semiconductor Fermi level pinning at the interface with the channel. Self-alignment is achieved, in one embodiment, by depositing selectively the passivation layer and then depositing the conductor thereon.

In other cases, however, suitably selective deposition techniques may not be available for many material combinations. Or, the material forming the passivation layer may also be present where deposition is not desired. For example, as occurs when $Si_3N_4$ is used both as a protection layer for the gate sidewall and as the passivation layer for the source/drain junction.

Figure 1A:
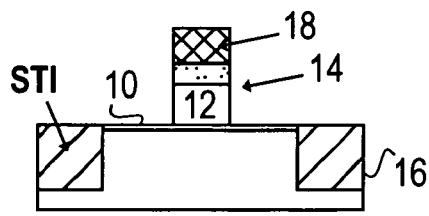
FIGS. 1a-1f illustrate various stages in a damascene gate transistor fabrication process as reported by Yagishita et al.
Figure 1D:
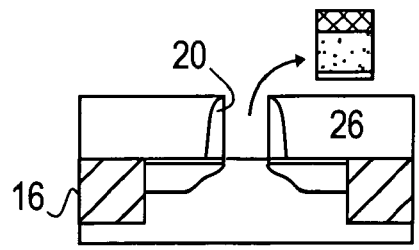
Figure 1B:
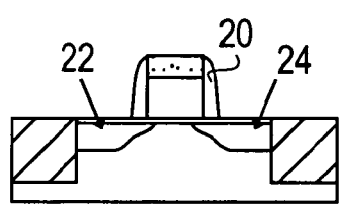
Figure 1E:
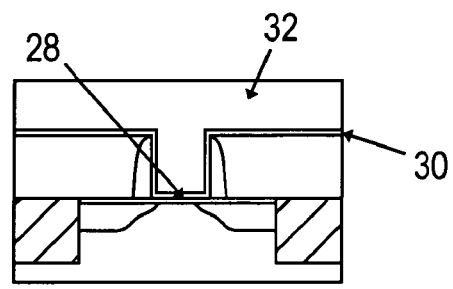
Figure 1C:
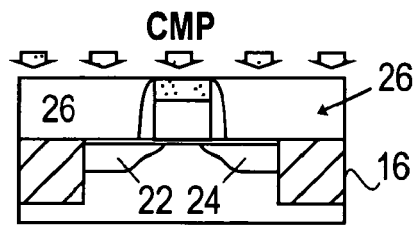
Figure 1F:
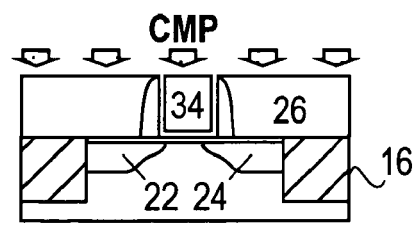
Figure 2:
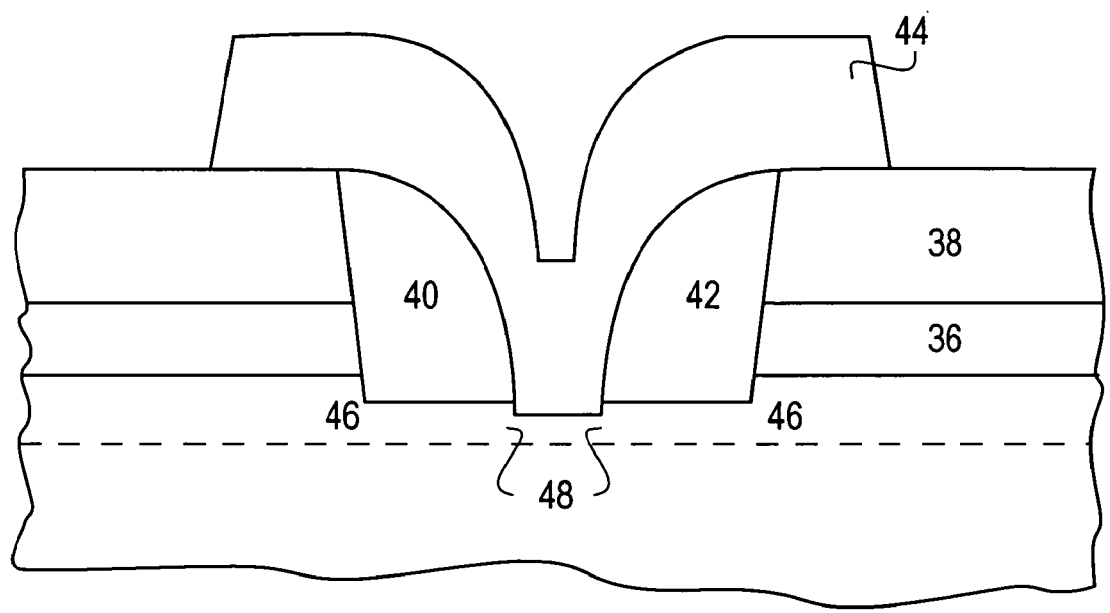
FIG. 2 illustrates an example of a transistor having a damascene gate and a deposited source/drain.
Figure 3A:
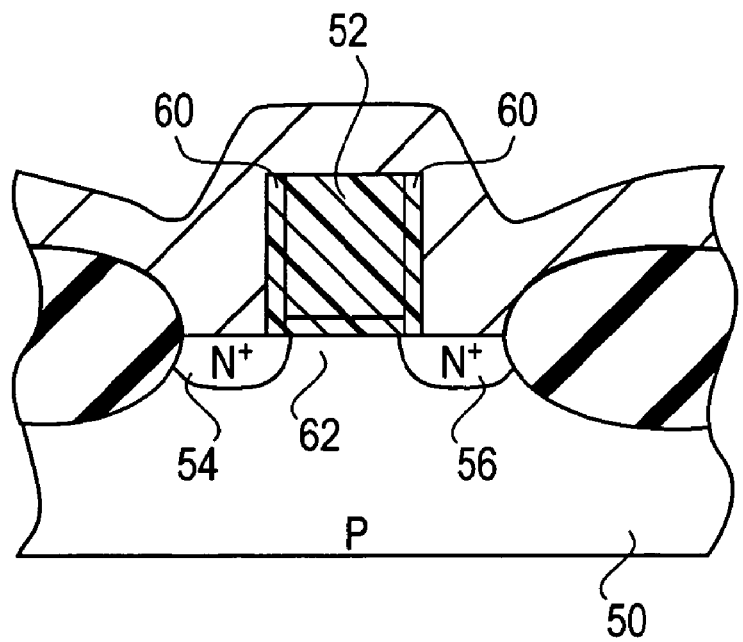
FIGS. 3a-3b illustrate formation of a damascene contact to n+ source/drains as reported by Hiruta.
Figure 3B:
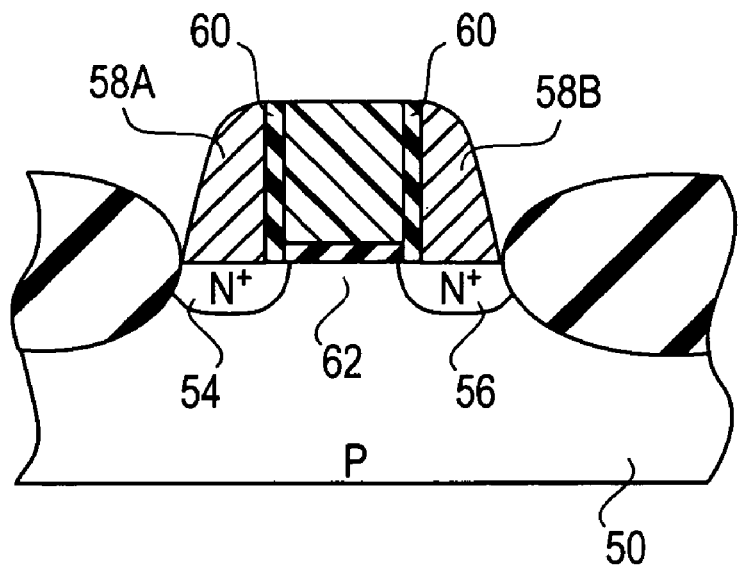
Figure 4:
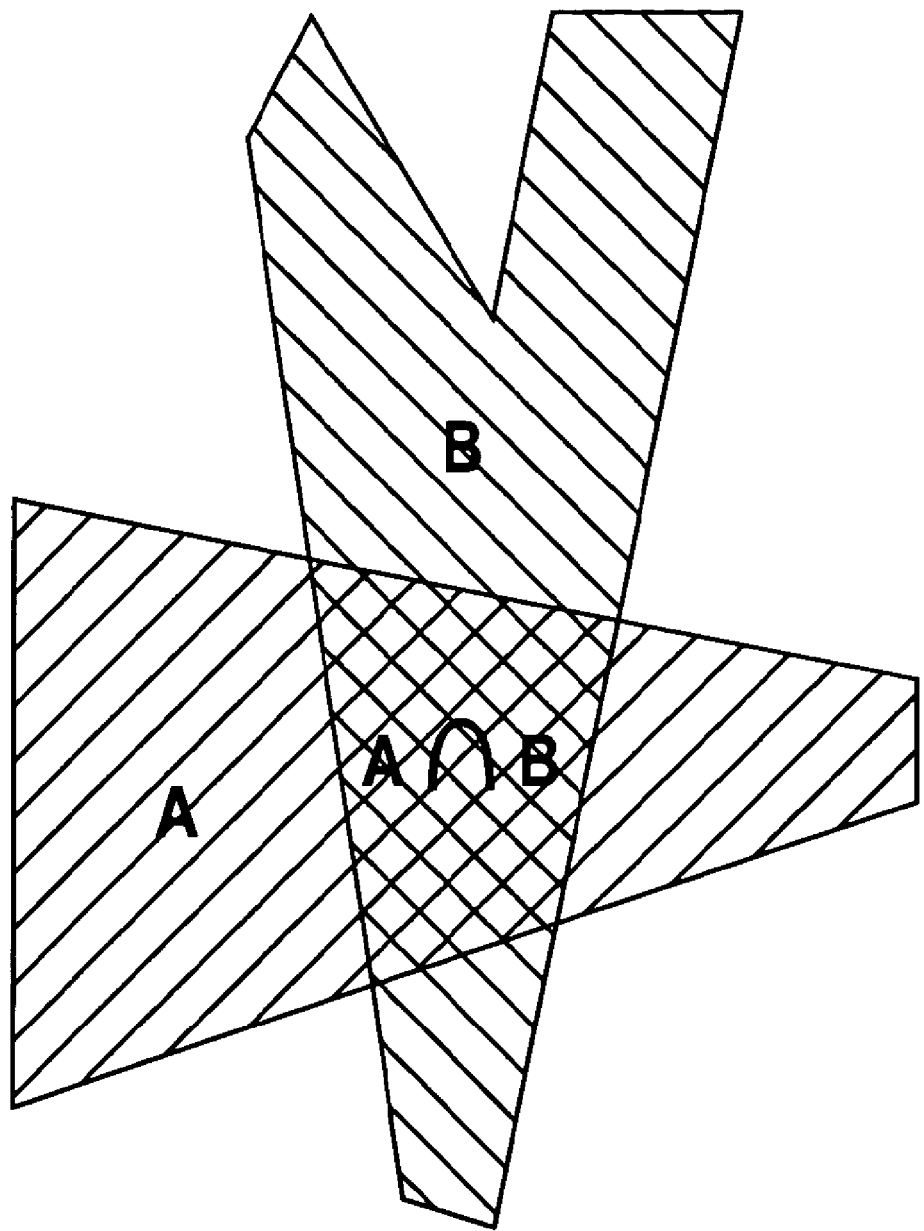
FIG. 4 illustrates in a graphical fashion the concept of self-alignment during various masking operations.

In any event, a feature of a self-aligned process is the use of only two patterns to form not only the source/drain region(s), but also the channel region and the region of the gate over the field. An abstract example is illustrated in FIG. 4. This drawing illustrates schematically a self-alignment scheme in which source/drain regions and the channel are each formed as a logical function of two masks, A and B. Pattern A, the active mask, is first transferred to the semiconductor, causing the region outside of A ($\overline{A}$) to be an isolation region (i.e., the "field") and preserving the region within A as an "active" region. Subsequent patterning using mask B (the "gate" pattern) creates an overlapping region (A∩B) that will become the channel The areas A∩$\overline{B}$ will be the source/drain and, in some cases, $\overline{A}$∩B extends the gate over the field. Notice that while B may be misaligned with respect to A, the intersection of A and B (A∩B) is always aligned with A and B and, in this way, the process is always self-aligned.

The key challenge for a deposited source/drain device, therefore, is to form the source/drain using the same pattern that was used to define the active area of the transistor. A basis for the present invention is that a recess can be formed in the region A∩B of FIG. 4 and a conductor deposited therein. Several approaches to forming such a recess are described below, as are a number of techniques for depositing the conductors. By creating the transistor device in accordance with these teachings, the source/drain conductor can thus be self-aligned to edges along two axes (a length axis, and a width axis) of the channel.

Before going further, it is important to recognize the distinction between a deposited source/drain (as that term is intended in the context of the present invention), and a source/drain formed, fully or in part, in deposited material. As indicated above, simply because material is deposited at some point in the transistor fabrication process, that procedure does not necessarily create a deposited source/drain. For example, others have exploited the strain, mobility, and band structure effects of $Ge_xSi_{1-x}$ in p-type source/drains. See, e.g., S. E. Thompson et al., *A logic nanotechnology featuring strained-silicon*, IEEE Electron Device Letters, v. 25, no. 4, pp. 191-3 (2004). In the reported process, the Si forming the device channel is recessed, then refilled with deposited $Ge_xSi_{1-x}$, and the region (along with a p-type "extension") is then implanted with acceptors to form p-type Si source/drains. Thus, implantation, not deposition, defines the source/drain. In this example the implantations extend beyond the deposited region and thus the source of holes to the channel is in the same Si that forms the channel region, not the deposited $Ge_xSi_{1-x}$.

In the context of the present invention, a deposited source/drain is one in which the deposited material itself forms the source/drain. For example, considering the process described immediately above, if the $Ge_xSi_{1-x}$ was deposited in-situ doped and it was this region that provided holes to the channel, then it would be a deposited source/drain in the context of the present invention. Alternatively, if a process subsequent to the deposition was performed which caused the source/drain to be formed essentially to, but not beyond, the interface between the deposited and the non-deposited region, that would be a deposited source/drain in the context of the present invention.

Definitions

Some further terms that have specific meaning in the context of the present invention are:
  1. active region: A region of a transistor consisting of the channel region(s), source region(s), and/or drain region(s). See also "field region".

2. channel tap: A conducting region which is the direct source or sink for carriers in a channel of a field-effect transistor. An example is an n+ source for an n-channel FET. Electrons from the source(s) are provided to the channel One or more drains may serve as a sink for electrons from the channel. Another example is a metal source or drain of a metal source/drain p-FET, within which holes conduct from the metal, possibly tunneling through or emitting over an intermediate potential barrier, into the channel. However, a metal contact to the n+ source is not itself considered a "source", as it is not the direct supplier of carriers to the channel. Electrons are readily available from the n+ doped region that is the "source". Likewise, a metal contact to a doped drain is not itself the "drain". For a metal source or drain, only the metal region from which carriers for the channel are sourced or sunk is the source or drain of the transistor; metal in more remote contact with these regions are neither the "source" nor "drain". Transistor channels may require electrons (a conventional n-channel FET), holes (a conventional p-channel FET), either (an ambipolar FET), or the carriers may be generated by physical processes controlled by channel tap potentials (e.g., an impact ionization FET, see K. Gopalakrishnan, et al., *Impact ionization MOS (I-MOS)-Part I: device and circuit simulations*, IEEE Transactions Electron Devices, v. 52, no. 1, pp. 69-76 (2005)). In the last case, there may be no formal "source" consistent with this definition, although there may be one or more drains.
3. field region: A region consisting neither of transistor source, drain, nor channel. In preferred embodiments of the present invention, conduction between source and/or drain regions of the same or different transistors, unless by design, should not be primarily via field region(s), but should instead be via active region(s). The field region(s) need not themselves be insulating, but if they are conducting, current should not flow between the field and the source(s) and/or drain(s) to be isolated. See also "active" region.
4. insulated-gate field-effect transistor: A device that consists of one or more gates (conventionally one) that modulate the conductivity of one or more channels (conventionally one) to which two or more channel taps (conventionally two) are connected, where the gate(s) are essentially insulated from the channel(s), such that the current flowing between the channel taps, when the transistor is in a conducting state, exceeds the current flowing between the gate and the channel tap(s) via the channel when the transistor is in a conducting state by at least a factor of approximately 1000. In an n-channel FET, the channel(s) consist(s) primarily of electrons. In a p-channel FET, the channel(s) consist(s) primarily of holes. In an ambipolar FET, the channel(s) can be either electrons or holes.
5. material stack: a stack of one, or more than one, material(s). A material stack is conducting if, for structural dimensions typical to the technology, electrical currents significant to the operation of typical circuit elements can be made to flow for some applied potential difference of a magnitude comparable to those encountered in the operation of circuits formed in the technology.
6. self-aligned: a process is "self-aligned" if one or more regions or boundaries resulting from the process has an orientation or position, relative to one or more other regions or boundaries, which is a natural consequence of the process, not involving the explicit positioning or orienting of masks or other pattern transfer mechanisms. For example, if a material is deposited in a recess, then etched to a level such that it remains only in the recess, the process is self-aligned to the edge of the recess or to regions or boundaries naturally aligned to the edge of the recess. Furthermore, a process in which a material, by virtue of chemistry or other means, is deposited in a recess, yet not in the region surrounding the recess, is self-aligned to the edges of the recess. On the other hand, if, following the formation of the material in both the recess and in the region surrounding the recess, a separate material is patterned via the manual alignment of a mask to one or more edges of the recess, and that second material is used to transfer a pattern to the first material which, depending on the success of the alignment, may be aligned or not aligned to the recess edge, then the process of patterning the first material is not "self-aligned".

Self-Aligned, Deposited Source/Drain Transistors

A deposited source/drain may be formed in various was. For example, in some cases the source/drain material(s) may be deposited on all exposed surfaces, and then planarized to remove excess material from regions outside the recesses. In other embodiments, the source/drain material may be deposited selectively in only the recesses. In still further cases, the source/drain material may be electrolytically deposited in the recesses. Or, as discussed above, the source/drain may be deposited in conjunction with one or more passivation layer(s), consisting at least in part of insulating materials of sufficient thinness to allow for current to flow in adequate density via tunneling process(es). In some embodiments of the present invention, one or more passivation layers may be formed via the anodization of one or more electrolytically-deposited materials. Alternatively, or in addition, the passivation layer may be covered with an electrolytically-deposited or autocatalytically-deposited conductor.

In some embodiments of the present invention, a recess is used to form the gate. As before, these are processes to fabricate a metal source/drain field-effect transistor in which the transistor is defined primarily by two independent pattern transfers. The first defines the union of the channel region and source/drain area(s), pattern A in FIG. 4. The second, pattern B in FIG. 4, defines the gate area. A simplified process, similar to the "super planar" process described herein, is schematically illustrated in FIGS. 18*a*-18*f*.

Figure 18A:
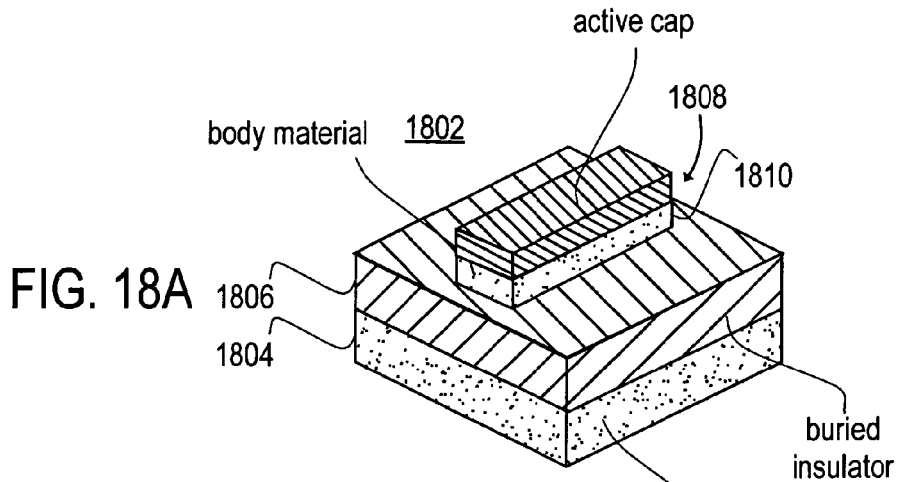
FIGS. 18a-18f illustrate various views of a transistor fabrication process in which both a gate stack and a source/drain material stack are deposited in recesses to achieve self-alignment of the source/drain along two axes in accordance with an embodiment of the present invention.

FIG. 18*a* illustrates a portion of a semiconductor wafer or die 1802 on which will be formed a device having a deposited source/drain as well as a deposited gate material stack. The wafer 1802 includes a substrate 1804 and a buried insulator 1806 thereover. The first pattern transfer forms a material stack 1808 (the "active cap" in FIG. 18*a*) over the appropriate regions, transferring the pattern into the "body material" 1810. In some embodiments, the body material may include at least the first layer of a multi-layer gate, including possibly one or more gate insulators. The figure illustrates isolation via removal of body material from the field, but other possibilities, such as an isolation implant, or a chemical reaction such as thermal oxidation, are also possible.

Figure 18B:
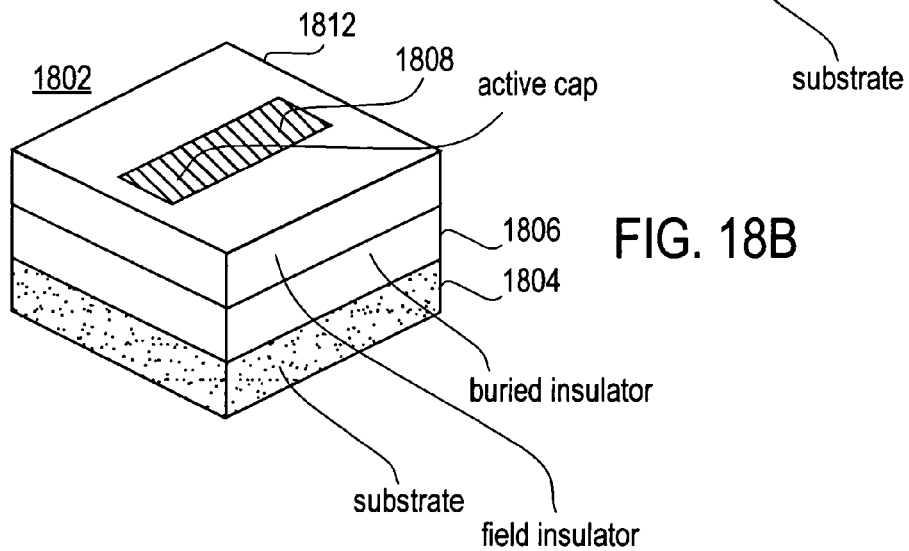
Figure 18C:
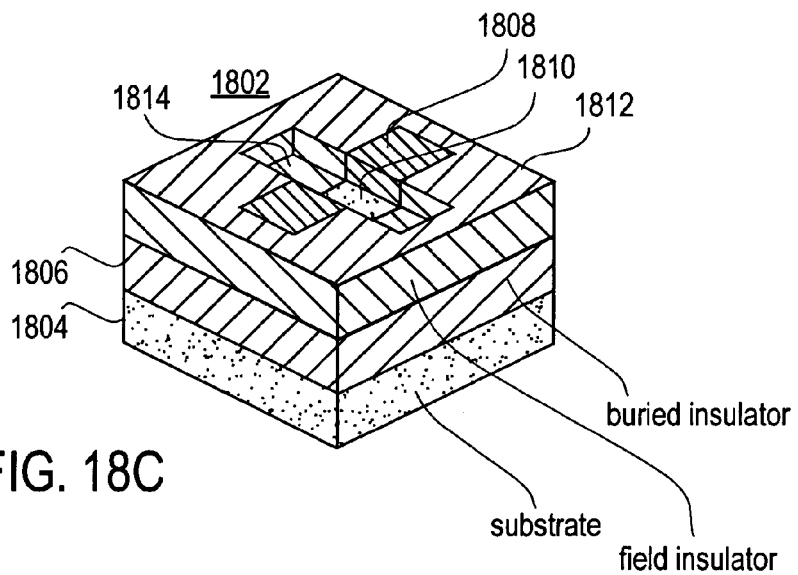

The recessed portion of the surface may then be filled with "field insulator" 1812 and/or planarized (FIG. 18*b*). The second pattern transfer then forms a recess 1814 in both the active cap 1808 and the field insulator 1812 (FIG. 18*c*).

Figure 18D:
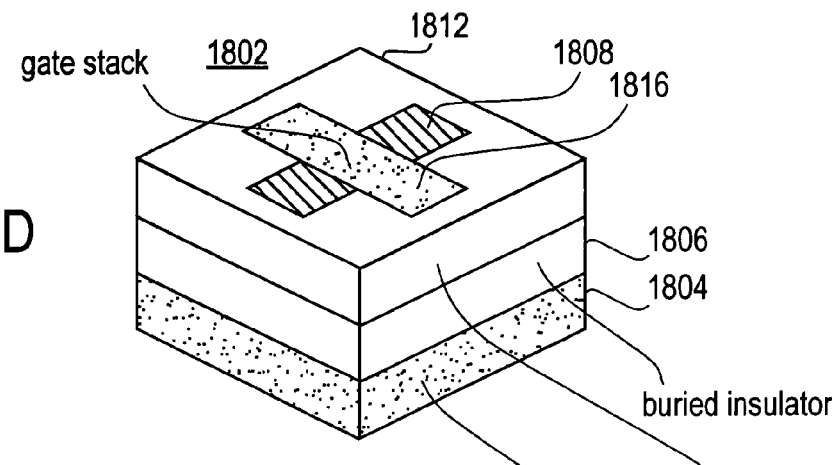

One or more gate layer(s) 1816, possibly including an etch-resistant cap, are then formed in this recess (FIG. 18*d*). The gate layer(s) 1816 may include one or more gate insulator layer(s), especially if one was not included in the body material.

Figure 18E:
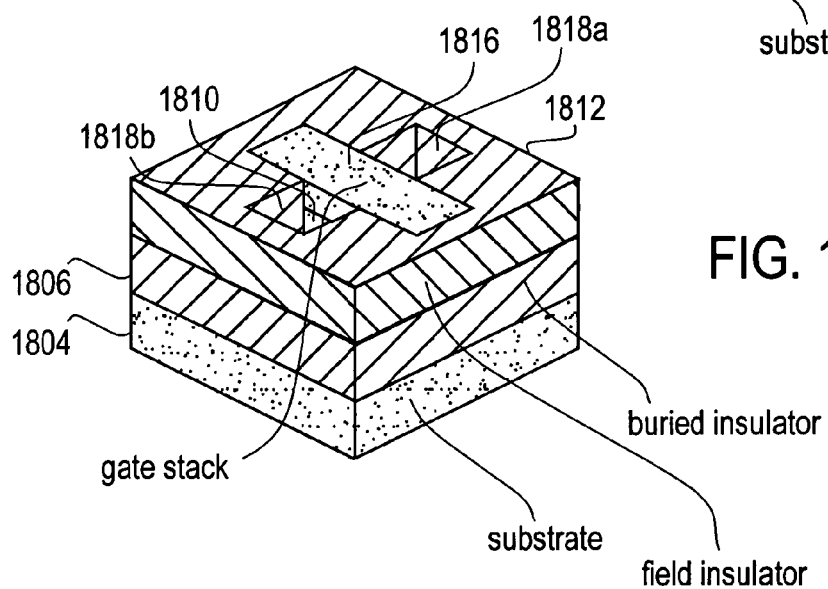

The active cap is then removed from appropriate regions 1818a and 1818b, including where the source(s) and/or drain(s) are to be formed, exposing the semiconductor near the semiconductor channel region. (FIG. 18e). The figure shows the etch extending into the body material 1810, but this need not be the case.

In various embodiments, the exposed sides of the gate stack 1816 may be protected with insulating material(s), to isolate the gate from the source/drain material(s) that are to be deposited next. This may be done prior to etching into the body material 1810, or after etching into some but not all of the body material to be etched. For example, if the body material includes a gate insulator and one or more conducting gate electrode layers, these may be etched prior to the gate sidewall insulation, with possibly any gate insulator layers, and possibly some or all of the underlying semiconductor layers in which the channel is to be formed, etched after the gate sidewall insulation. In the example as is described in the "super-planar" process, a $Si_3N_4$ spacer is formed for gate sidewall insulation.

Figure 18F:
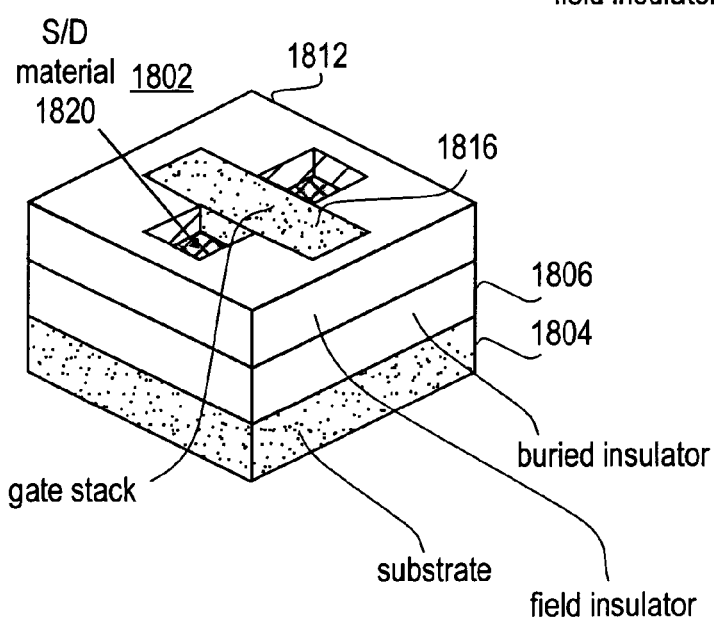

The recessed regions 1818a, 1818b are then filled with the source and/or drain material(s) 1820, which may consist of conductor(s) and possibly insulating and/or semiconductor layer(s), of which at least the conducting layer(s) are removed from regions which were not recessed, forming the basis for a "self-aligned" transistor. The filling may or may not be to the top of the recesses. Some embodiments may fill it only partially. Or, the recess may be filled beyond its top surface and planarized to confine the source/drain material(s) to the recess. The source/drain material(s) may then be etched back to below the maximum height of the source/drain recess. A recessed source/drain is illustrated in FIG. 18f.

It is important to recognize that the recess(es) (e.g., recesses 1818a, 1818b and/or 1814 in the above example) in which the gate and/or source/drain material is deposited may be of any orientation. For example, in some embodiments, the recess may have a top and bottom roughly parallel to the plane of a starting substrate, fully exposed to the ambient in the direction perpendicular to the plane of the starting substrate. However, in other embodiments, the recess may be a cavity, with regions not exposed in this direction. In some of these embodiments, the deposited source/drain material may be removed from regions that are exposed in this direction, leaving material in regions not exposed. One approach to forming such cavities is a sacrificial source/drain process, in which semiconductor in the source/drain regions is processed in a fashion which sensitizes it to a subsequent etch process, then the region is covered with an insulator, then a hole is etched to the sensitized material in the source/drain region, then the sensitized material is removed (leaving a cavity). Various approaches to "sensitizing" the semiconductor to subsequent etches include the incorporation of ionized impurities (for example, implanting arsenic to form an n-type region), chemical conversion (for example, reacting Si with a metal such as Pd to form a metal silicide such as PdSi), electrochemical conversion, conversion to porous material, and disruption of crystallinity. An example of the last case is amorphization via the implantation of energetic $Si^+$ into crystalline Si. With these approaches, the one or more cavities can be subsequently filled with one or more source/drain materials, for example by conformal deposition followed by an etch that removes material outside the one or more cavities, or via selective deposition on the exposed material which forms the channel region.

Exemplary Processing Methods and Electrical Devices Formed Thereby

The examples presented below are all examples of the methods and apparatus of the present invention. The inclusion of these examples is not, however, meant to limit the scope of the present invention as defined by the claims set forth at the end of this specification. Instead, these examples are included so as to provide the reader with an appreciation of the many and varied contexts in which the methods of the present invention can be employed and of the varied forms of devices which can be fabricated in accordance with those methods.

Several examples are provided, each based on Si technology. Some examples presented are for a single type of transistor, an n-channel MOSFET, with a single level of metal interconnects. It should be appreciated that in many commercial processes more than one type of device will be fabricated during the same integrated process, consequently it should be recognized that the processes described herein can be readily adapted to process multiple devices. An example of such an extension, a Complimentary Metal Oxide Semiconductor (CMOS) process, is discussed at the end of this section. Further, in as much as conventional production processes typically encompass multiple levels of metal interconnects, the inventors recognize that the methods of the present invention described can likewise be adapted to devices that include multiple levels of metal interconnects.

As more fully discussed below, some of the examples described below use a "positive gate" process, wherein the gate is formed via the formation of a thin film and the selective removal of that film such that it remains in "gate" regions. This is in contrast to a "negative gate" process, wherein the film is removed from the gate regions but retained elsewhere. The positive gate process has the advantage of being more closely aligned with typical industry gate patterning practices at the time of this writing. See, e.g., A. Blosse et al., *A Novel Low Cost 65 nm CMOS Process Architecture With Self Aligned Isolation and W Cladded Source/Drain*, IEEE Transactions of 2004 International Electron Device Meeting, pp. 669-672. However, while this reported process supports aspects of the present invention, it is not an example of it, nor is the present invention an obvious derivative thereof.

Another of the examples below is a negative gate process utilizing a "damascene gate", in which the gate material is formed in a recess left by a patterned etch. A further example uses a "sacrificial source/drain", in which source/drain material is conformally deposited in a cavity left by the removal of a "dummy" source/drain. Two versions of a sacrificial source/drain are disclosed, one for a "FinFET" (a FET with opposing sidewall channels), and the other for a planar silicon-on-insulator FET. Interestingly, the "sacrificial source/drain" process is also a positive gate process.

In each of the following examples various materials are presented as candidates for the process being described. However, it should be understood that other materials may be substituted for those listed herein and that the use of these different materials is deemed to be within the scope of the present invention. For example, the following descriptions are of technologies based on the use of Si as the semiconductor. However, the present methods apply equally if the semiconductor were Ge, C, $Ge_xSi_{1-x}$, $Si_xC_{1-x}$, $Ge_xSi_yC_{1-x-y}$, GaAs and other III-V compounds and alloys, and GaN and other II-VI compounds and alloys. Additionally, there is no constraint on the type of the semiconductor to be used. The invention applies equally to crystalline, polycrystalline, amorphous, molecular semiconductors. Crystalline Si is used as an example, because of its prominence in the semiconductor device industry at the time of this writing. The examples are of "silicon on insulator" (SOI) technology, in which the devices are formed in thin Si films on a substrate capped with an insulating $SiO_2$ layer. However, the invention applies equally well to other starting material types, perhaps most notably "bulk wafers" consisting entirely of silicon.

Many of the following examples of processes share certain features. For example, the first two processes, and the planar FET version of the third, begin with a silicon-on-insulator wafer having a surface silicon thickness no more than approximately 30% the gate length of the shortest transistors for which low off-state current is required. A typical approach at the time of this writing is to start with a thicker silicon film, thermally oxidize it until the unconsumed silicon thickness is the target value, then etch the surface $SiO_2$ in an HF solution to expose the thinned silicon film. The surface silicon should be sufficiently lightly doped that it be in a "fully depleted" state for operating conditions encountered in typical circuit operation. The "FinFET" process described below typically utilizes a thicker Si layer, for example 100 nm for gate lengths less than 100 nm.

Figure 5:
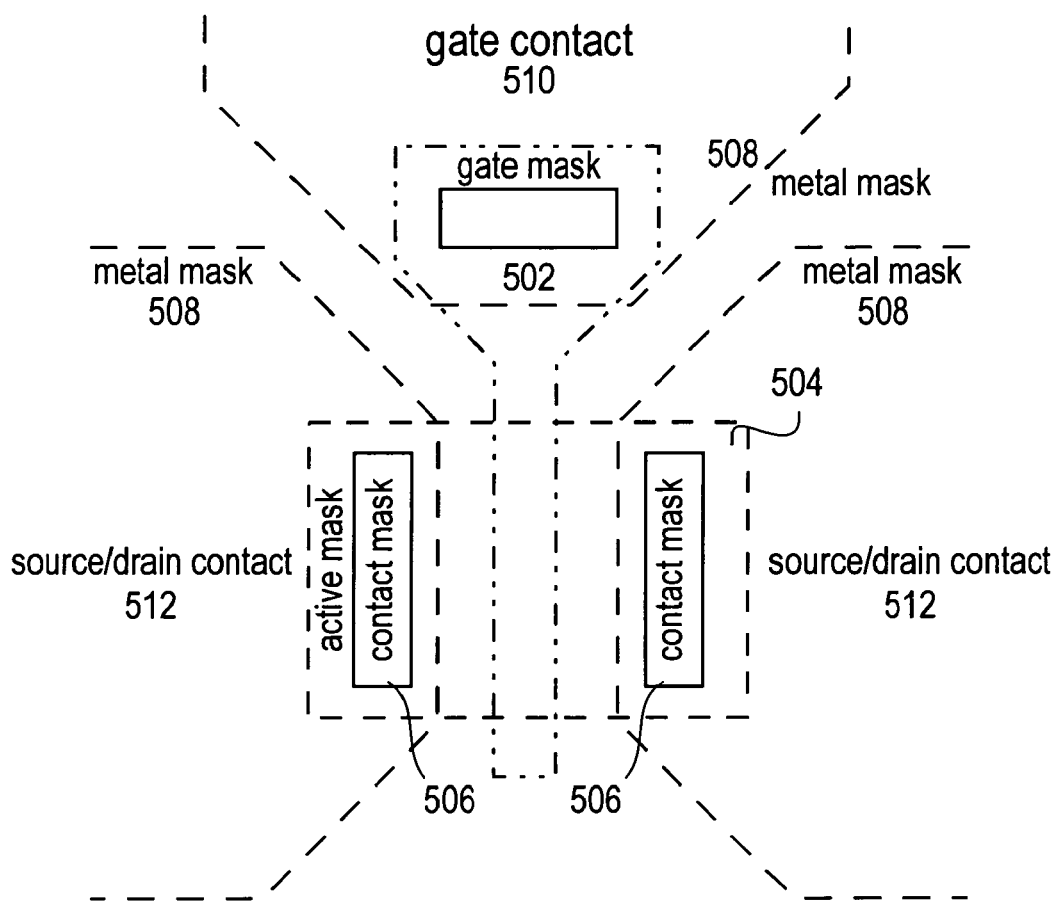
FIG. 5 illustrates typical mask layouts for transistors fabricated in accordance with various embodiments of the present invention.

Devices in the process described below are assumed to be defined in "masks", used in pattern transfer processes via the exposure of "photoresist", for example, a photo-sensitive polymer which, subsequent to exposure to light, can be selectively removed to form the pattern defined by the appropriate mask. The remaining photoresist is used to protect underlying regions from process steps performed while the photoresist is in place and may subsequently be removed once those process steps have been completed. Examples of such masks, including a gate mask 502, an active region mask 504, contact masks 506, and various metal layer masks 508 are shown in the FIG. 5. In particular, this illustration shows typical mask layouts for defining a transistor in accordance with embodiments of the present invention. Lines define the boundaries of each mask layer, with a unique line pattern assigned to each layer. The "gate contact" 510 describes the location of the metal connected to the gate, while the "source/drain contact" 512 describes the location of a metal line connected to a source/drain. The relative dimensions of these masks are typical of planar MOSFETs; FinFETs typically have channel regions narrow in comparison to their length, and typically have multiple parallel channel regions.

The following process flow descriptions are intended to be summary in nature. Consequently, for some steps in these processes conventional techniques may be used to accomplish the stated result. For example, if a step calls for the deposition of a $Si_3N_4$ layer, it may be beneficial (as is known in the art) to deposit a thin "buffer layer" of $SiO_2$ under the $Si_3N_4$ layer. This may require subsequent additional steps later in the process, for example etching of the buffer layer.

A. Self-Aligned Mesa Planar MOSFET Process

The first example of a process for creating a transistor in accordance with an embodiment of the present invention is a self-aligned, mesa planar MOSFET process and is described with reference to FIGS. 6-9. Among the features of this process is the use of a two-stage gate material formation to form a recess, self-aligned to the edges of the channel along both "length" and "width" axes. This recess is then filled with the source/drain material in a "damascene source/drain" process.

Figure 6A:
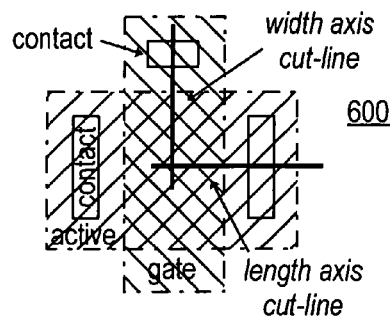
FIGS. 6a-6c illustrate top-view, length axis cut-away and width axis cut away views, respectively, of a transistor fabricated in accordance with a self-aligned mesa process that is an example of the present invention.
Figure 6B:
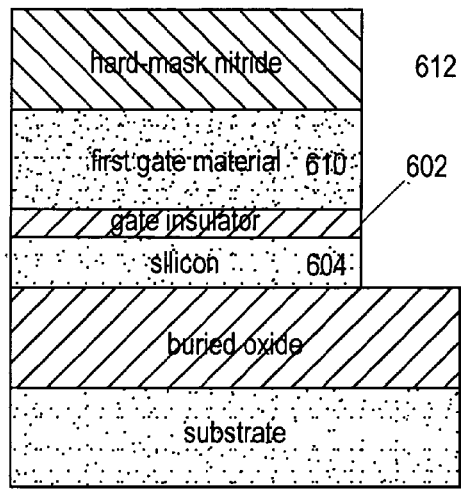
Figure 6C:
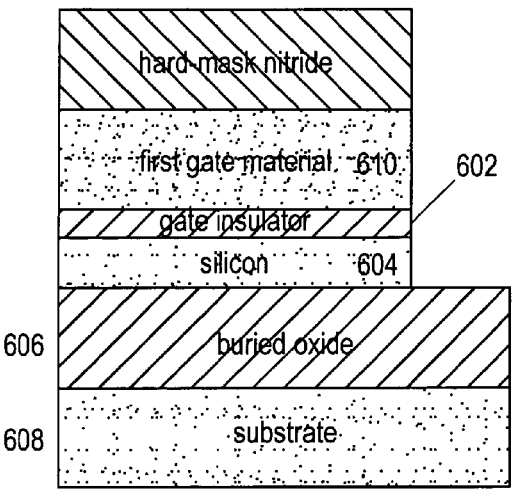

Referring first to FIGS. 6a-6c, which show, respectively, a top-view of the fabricated device 600 along with two cross-sectional view thereof, one taken along a length axis and the other along a width axis, a gate insulator 602 is formed, for example via the growth of $SiO_2$ or $SiO_xN_y$, over a silicon layer 604 disposed over a buried oxide 606 on a substrate 608. A first gate material 610, for example, polycrystalline silicon or nickel silicide, is deposited followed by deposition of a silicon $Si_3N_4$ "hard mask" layer 612 thereon. The "active" mask is patterned, and the $Si_3N_4$ hard mask 612, the first gate material 610, the gate insulator 602, and the silicon 604 are all etched from field regions. Optionally the etch can extend into the buried oxide 606 and even into the substrate 608. This may even be advantageous. Following the etch, the photoresist comprising the active mask may be removed.

Referring now to FIGS. 7a and 7b, which show cross-sections of the self-aligned mesa along the length and width axes, respectively, a thick $SiO_2$ field oxide 614 is deposited and planarized to the level of the $Si_3N_4$ hard mask, for example via a chemo-mechanical polish. This may be followed by an over-etch to reduce the step height between the top of the field oxide 614 and the top of the first gate material 610. The $Si_3N_4$ hard mask may then be removed from the remaining first gate material and a thin, second gate material 616 deposited. Examples of appropriate second gate materials include refractory metals and metal silicides. The material should be continuous across any topographical step at the active/field boundary.

A new $Si_3N_4$ cap 618 may now be deposited on the second gate material 616 and the structure patterned using the "gate" mask. Thereafter, the $Si_3N_4$ cap 618 and second gate material 616 are etched where exposed. This etch should be selective to the field oxide.

Where exposed the first gate material 610 is now etched, preferably stopping before etching all of the underlying gate insulator 602. This etch should also be selective to the field oxide.

Now gate sidewall spacers 620 may be formed. Options include, but are not limited to, a thermally grown oxide of the first gate material, deposited $SiO_2$, and deposited $Si_3N_4$. In the case of deposited sidewall spacers, one approach is to deposit a conformal film, followed by an anisotropic etch (the preferential etch direction normal to the surface of the substrate) until the film is removed from the appropriate planar portions of the surface. Another option is a selective deposition of $Si_3N_4$ on the first and second gate materials. At the end of this step, $Si_3N_4$ should remain on the second gate material (the cap 618) and on the sidewalls of each gate material. For the Si-based technology described herein, assuming devices operating with biases of approximately or less than 1 V, this spacer should have a length (dimension along the transistor length-axis) at the end of the process of no greater than approximately 10 nm. For high-voltage devices, or for the drain side of transistors with asymmetric source and drain, the length at the drain side might be greater.

Figures 8A, 8B:
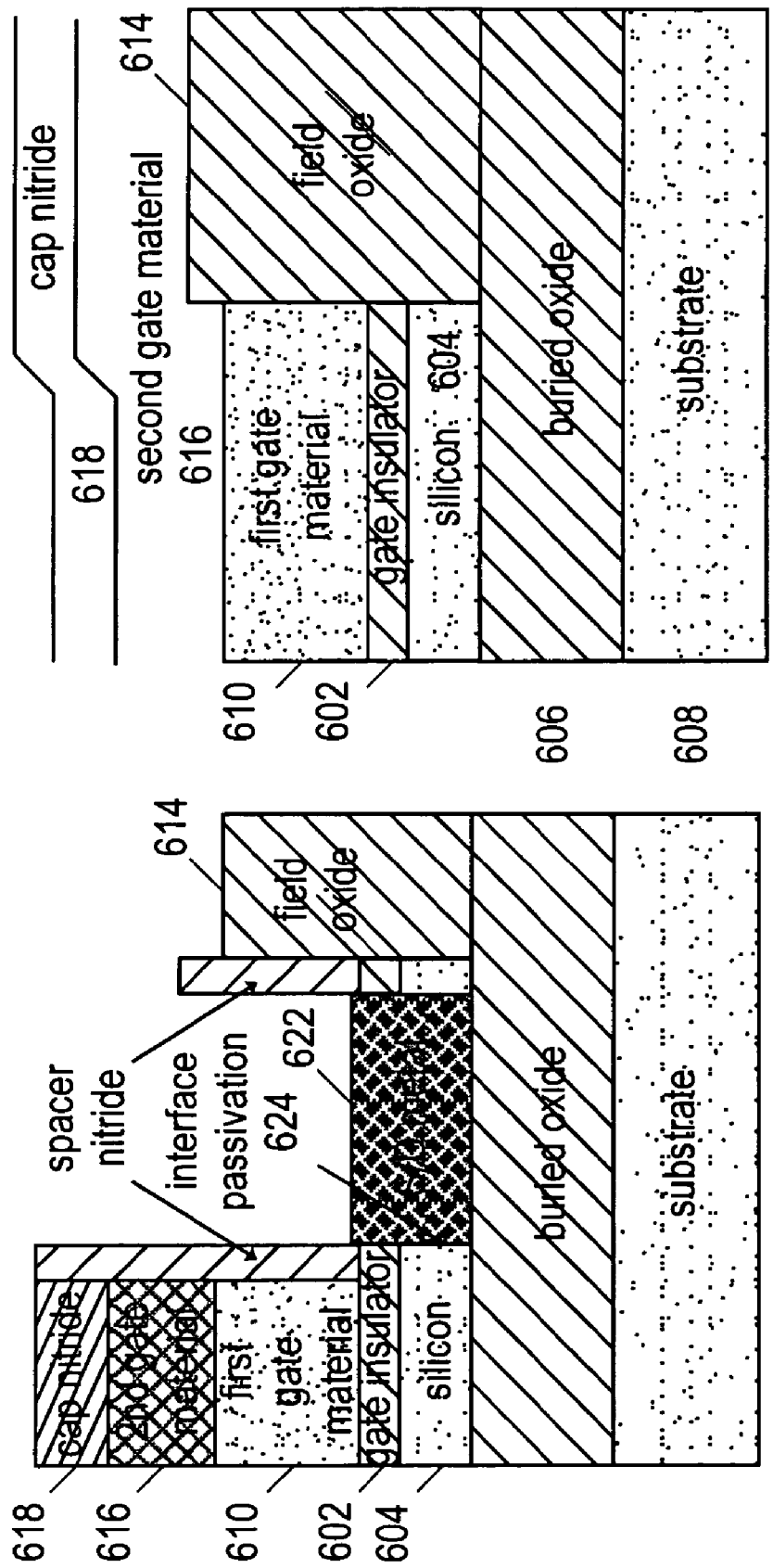
FIGS. 8a-8b illustrate the length and width axes cut away views, respectively, of the self-aligned mesa transistor at still further stages of fabrication in accordance with an embodiment of the present invention.

Now turning to FIGS. 8a and 8b, which illustrate length axis and width axis views, respectively, of the self-aligned mesa at a later stage of processing, the exposed gate insulator 602 is etched. Therafter, the exposed silicon 604 is anisotropically etched to form sidewalls that will define the edges of the source/drains. The source/drain conductor 622, for example a low-workfunction metal is now deposited in the recess left by the etch of the silicon. If desired, a stack of materials can be used. For example an ultra-thin passivation layer 624 (such as $Si_3N_4$) capped with a thin low-workfunction metal (for example, $LaB_6$, Yb, Mg, or Er) capped with a "protection layer" (for example, Ti or TiN) capped with a low-resistivity metal (for example, Al) can be used. The surface passivation may require a high-temperature (e.g., on the order of 900° C.) anneal in ultra-high vacuum to prepare the Si surface. Or, another approach, such as an $O_3$ clean, may be used.

The source/drain metal 622 is then planarized, for example by CMP, to the plane of the $Si_3N_4$ cap 618 on the gate, and a timed etch is used to recess the metal 622 to approximately the level of the top of the silicon 604.

Turning finally to FIGS. 9a and 9b, which show length and width cross-sections, respectively, of the completed transistor formed by the self-aligned mesa process, a thick "sub-metal" insulator 626 is deposited. Examples of possible materials for this structure include $SiO_2$, fluorinated $SiO_2$, an insulating polymer, spin-on glasses, and porous and non-porous dielectric resins. The sub-metal insulator is, optionally, planarized, and then patterned by the "contact" mask.

Vias (contact holes) are etched in the insulator 626, stopping on the second gate material 616 and on the appropriate conductor 622 in the source/drain stack. These vias must be etched through the "sub-metal" insulator and through the $Si_3N_4$ cap on the second gate material. The contact mask photoresist is removed and, optionally, the vias may be filled with a via fill metal, such as W. A pad metal 630, for example, Al, is deposited and patterned using a "metal" mask. Following the etch of the pad metal, the mask photoresist may be removed, leaving the structure shown in the illustrations. At this stage, processing can continue, for example via the formation of additional insulating and metal layers. Or, the device can be probed via the "pad metal", or it can be packaged with connections made to the device via the pad metal.

B. Super-Planar Planar MOSFET Process

The characteristics of this process are planar surfaces at various stages of fabrication, and a "damascene" gate in addition to the "damascene source/drain". An abbreviated process flow description follows.

Figure 10A:
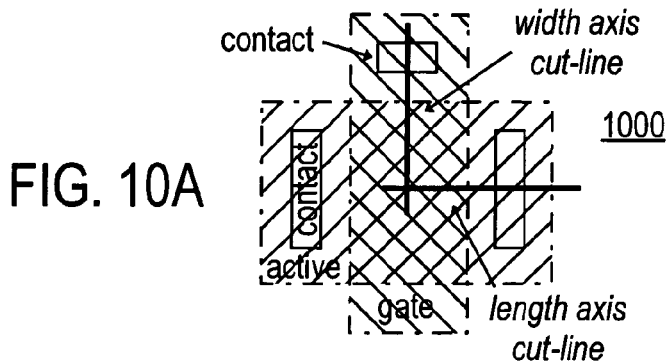
FIGS. 10a-10c illustrate top view and length and width axes cut away views, respectively, of a transistor fabricated in accordance with a super-planar process, which is an example of the present invention.
Figure 10B:
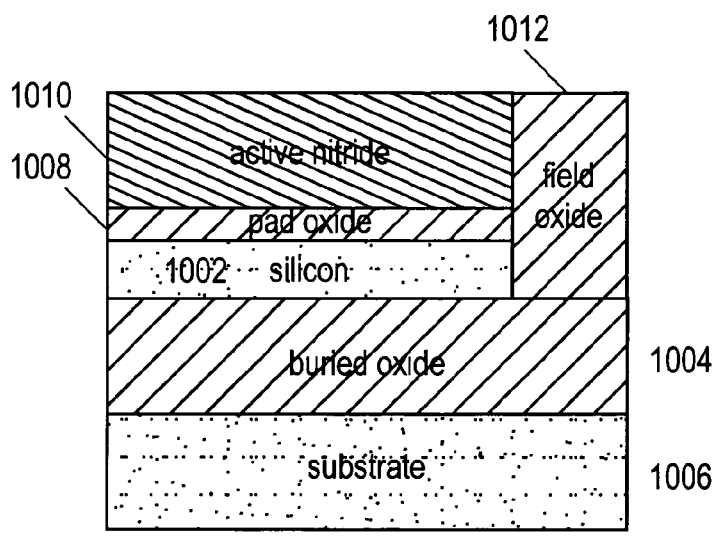
Figure 10C:
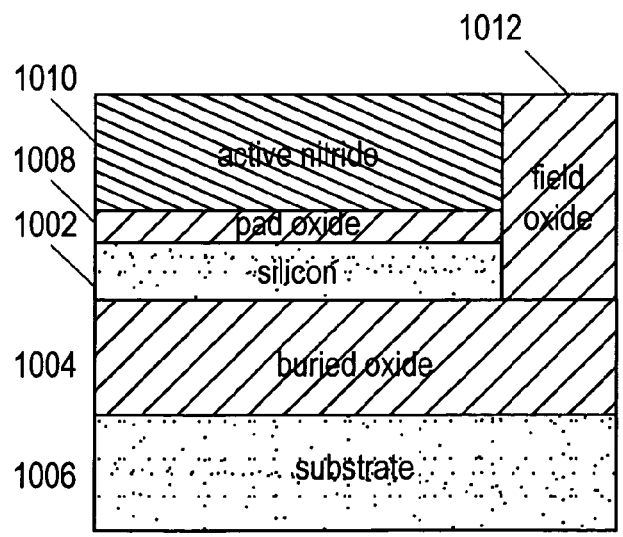

Referring first to FIG. 10, which shows a top view of the device 1000 under fabrication (after a field oxide planarization step) along with cross-sections along the length and width axes thereof, a thin silicon layer 1002 is disposed on a buried insulator 1004, which itself is disposed on a substrate 1006. In some cases, a gate insulator and the first part of a gate electrode may be formed on the thin silicon layer 1002. This may be advantageous for etch selectivity later in the process. However, the process described here assumes the gate insulator and gate electrode are fully formed in a later step.

A pad oxide 1008 is grown and an $Si_3N_4$ layer 1010 deposited on the Si film 1002. The initial silicon film thickness must be sufficient to accommodate the reduction in thickness associated with the pad oxide growth. The height of the gate insulator-gate conductor stack will be planarized to the $Si_3N_4$ layer.

Next, the active mask is patterned and the $Si_3N_4$ layer 1010 and pad oxide 1008 are etched from the field region. Likewise, the silicon 1002 is selectively etched from the field region, for example with a plasma. Optionally, a thin $SiO_2$ layer may be grown on the silicon sidewalls to consume material damaged from the silicon etch of the preceding step. A field oxide 1012 is deposited, for example via a chemical deposition of $SiO_2$, and planarized to the level of the top $Si_3N_4$ layer 1010 surface.

Figure 11A:
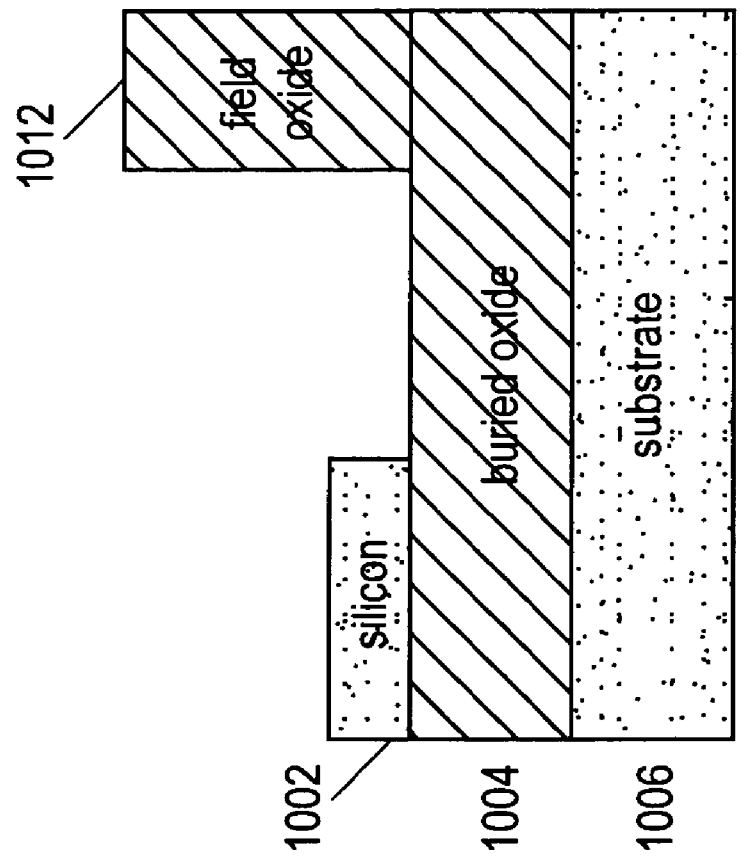
FIGS. 11a-11b illustrate the length and width axes cut away views, respectively, of the super-planar transistor at further stages of fabrication in accordance with an embodiment of the present invention.
Figure 11B:
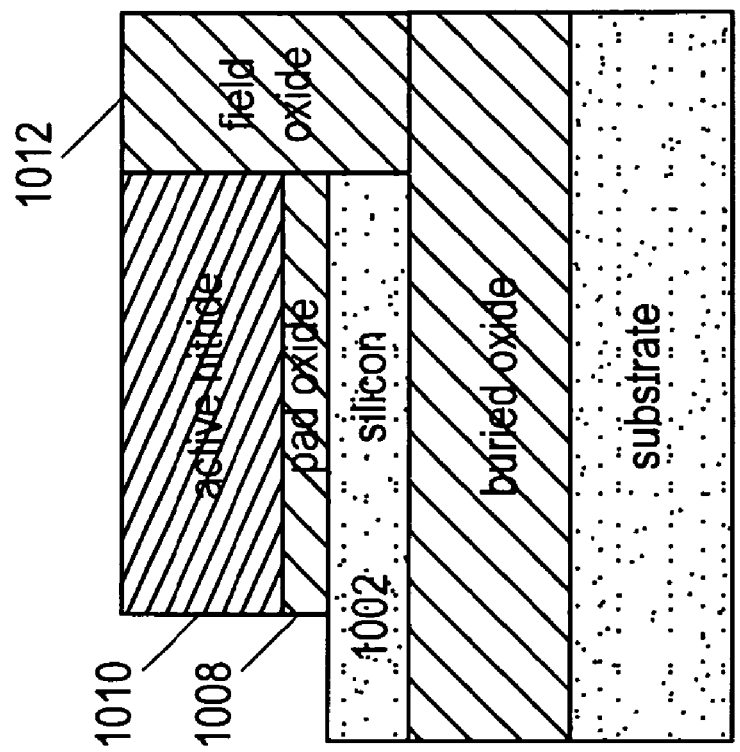

Turning now to FIGS. 11a and 11b, which show, respectively, length and width axes cross-sections of the super-planar device, an optional anneal in oxygen may be used to improve the quality of the deposited $SiO_2$. Next, a negative-polarity gate mask is patterned. This patterning removes photoresist from the regions in which the gate is to be formed, leaving it where the gate is to not be formed. The exposed $Si_3N_4$ 1010 is etched to roughly stop on the $SiO_2$ of the pad layer 1008. The exposed $SiO_2$ is etched, selective to silicon, to a thickness sufficient to form the gate electrode regions in the field. It is assumed here the etch stops at the level of the buried oxide 1004. The remaining photoresist is then removed.

Figures 12A, 12B:
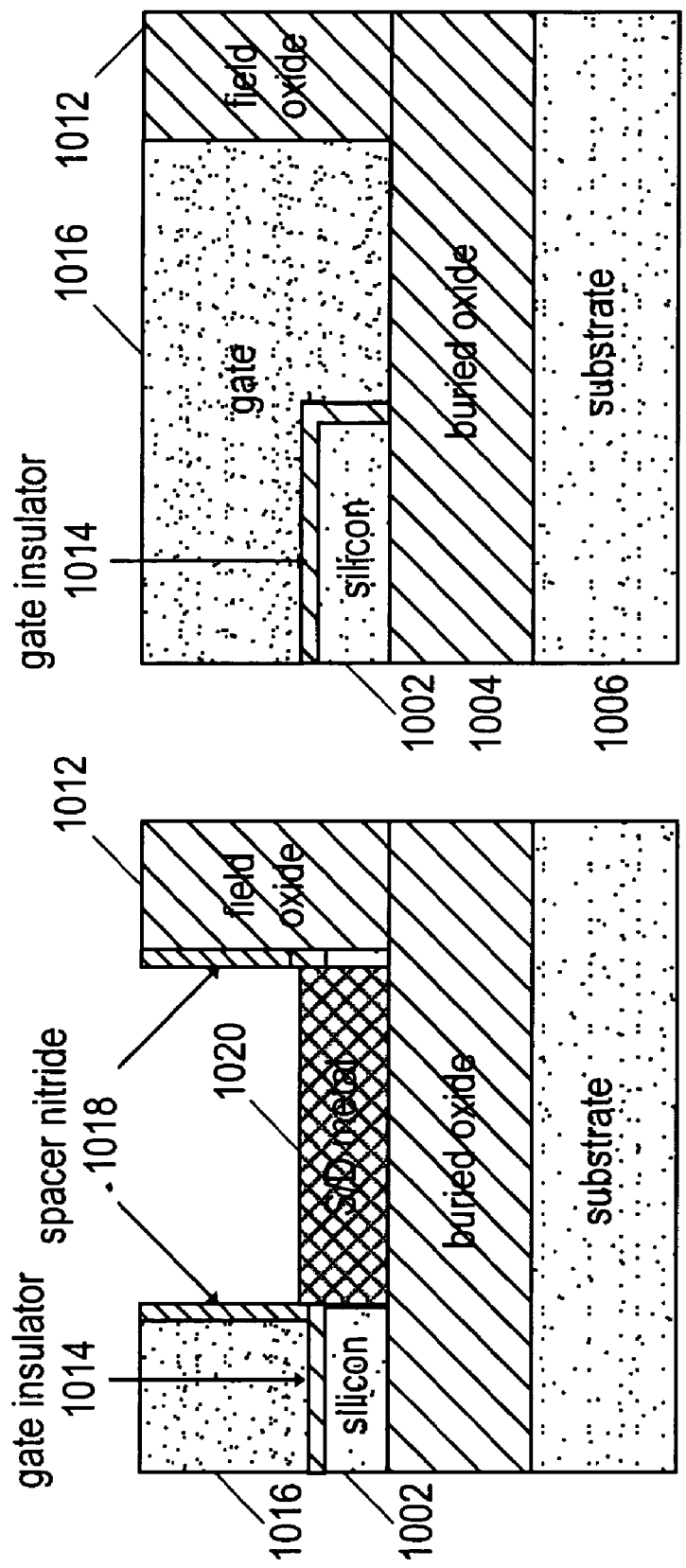
FIGS. 12a-12b illustrate the length and width axes cut away views, respectively, of the super-planar transistor at still further stages of fabrication in accordance with an embodiment of the present invention.

Referring to FIGS. 12a and 12b, which show, respectively, length and width axes cross-sections of the super-planar device, the gate insulator 1014 may now be formed, for example via the growth of $SiO_2$ or $SiO_xN_y$. In the alternate embodiments described above, the gate insulator is already present so this step is skipped. Next, the gate electrode material 1016, for example, polycrystalline Si or a conductor of suitable workfunction, is deposited. In the alternate embodiments described above this is not the lowest level of the gate electrode, but rather is the component that extends over the field. The gate material 1016 is planarized to the level of the cap $Si_3N_4$ (not shown) or field oxide 1012 surface.

Thereafter, the cap $Si_3N_4$ may be selectively removed, stopping on the oxide. Some etching of the field oxide 1012 may occur, but there should be a selectivity of at least approximately six, depending on the dimensions. Optionally, the pad oxide on the exposed silicon 1002 may be etched. If so desired, this pad oxide may be replaced with either an alternate material (such as an insulator suitable for forming an overlap structure, see, e.g., D. Connelly et al., *A new route to zero-barrier metal source/drain MOSFETs*, IEEE Trans. Nanotechnology, v. 3 no. 1, pp. 98-104 (2004); a metal overlap process additionally requires subsequent steps not described here), or with an oxide of superior quality.

A spacer 1018 is formed on the side of the gate. The length remaining after this step should be approximately 3-10 nm, ideally approximately 4 nm. Note in the figure the spacer also forms around the S/D area perimeter.

The pad oxide is etched outside the spacer. If the spacer 1018 is also oxide, this will need to be an anisotropic etch. Next, the silicon 1002 is etched, anisotropically, outside the spacer 1018, preserving sufficient gate material 1016.

Now, the source/drain conductor 1020, which may be for example a low-workfunction metal, can be deposited. A stack can also be used, for example an ultra-thin passivation layer (such as $Si_3N_4$) capped with a thin low-workfunction metal (for example, $LaB_6$, Yb, Mg, or Er) capped with a "protection layer" (for example, Ti or TiN) capped with a low-resistivity metal (for example, Al). The surface passivation may require a high-temperature (for example, 900° C.) anneal in ultra-high vacuum to prepare the Si surface. Or, another approach, such as an $O_3$ clean, might be used.

The source/drain metal 1020 is planarized, for example by CMP, to the plane of the $Si_3N_4$ cap on the gate 1016, and a timed etch is then performed to recess the metal to approximately the level of the top of the silicon 1002.

Figures 13A, 13B:
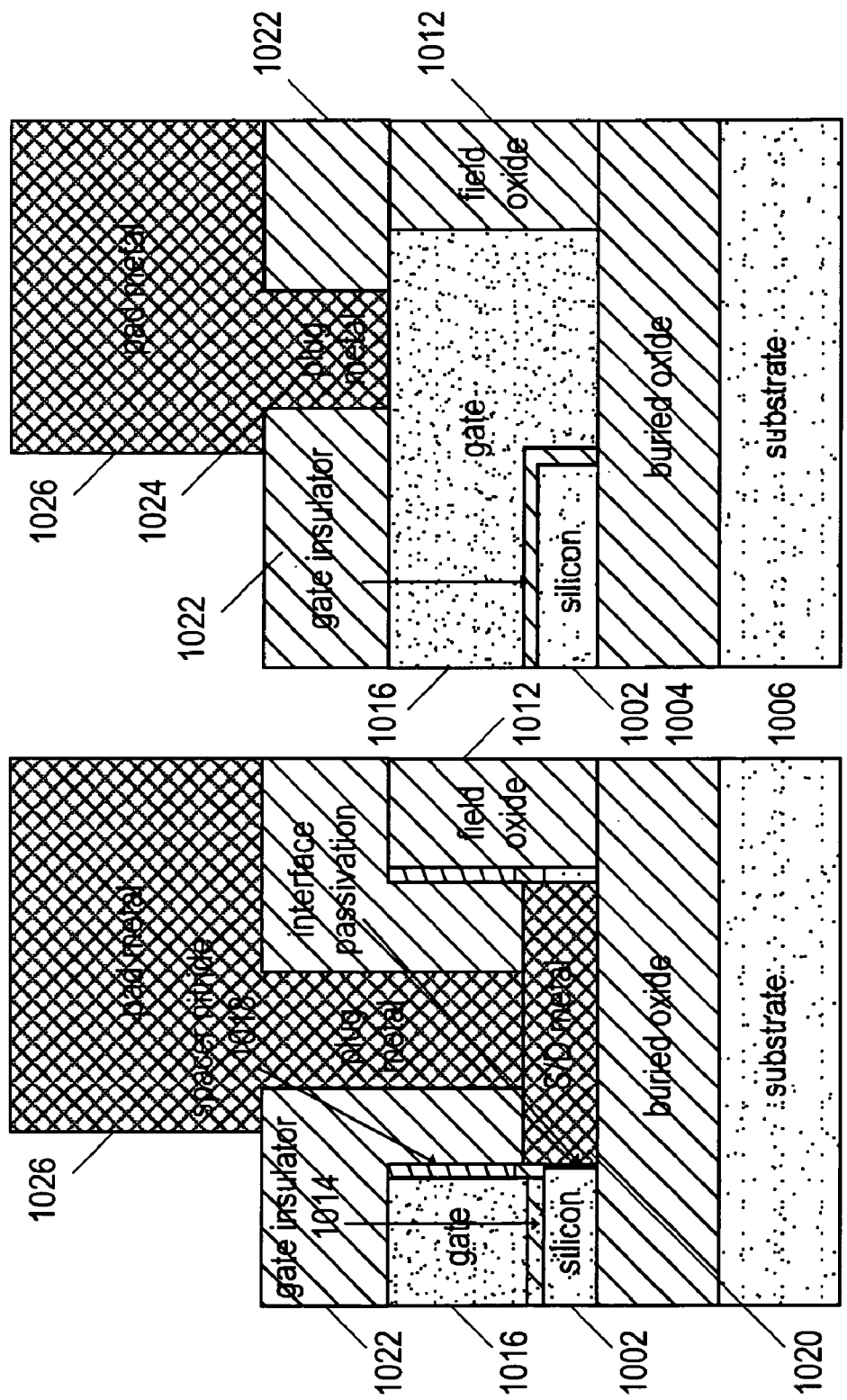
FIGS. 13a-13b illustrate the length and width axes cut away views, respectively, of the super-planar transistor at yet further stages of fabrication in accordance with an embodiment of the present invention.

Finally, referring to FIGS. 13a and 13b, which illustrate length and width axes cross-sections, respectively, of the super-planar device, a thick "sub-metal" insulator 1022 is deposited. Examples of possible insulating materials include $SiO_2$, fluorinated $SiO_2$, an insulating polymer, spin-on glasses, and porous and non-porous dielectric resins. Optionally, this sub-metal insulator 1022 may be planarized.

Planarizing using a "contact" mask is performed and vias (contact holes) etched in the insulator 1022, stopping on gate material 1016 and on the appropriate conductor in the source/drain stack 1020. These vias must be etched through the "sub-metal" insulator.

Following the etch, the contact mask photoresist may be removed and, optionally, the vias filled with a via fill metal 1024, such as W. A pad metal 1026, for example, Al, may then be deposited, patterned using a "metal" mask, and finally etched to the desired thickness. Afterwards, the remaining metal mask photoresist is removed.

C1. Sacrificial Source/Drain with Deposited S/D

The processes just described, the "self-aligned mesa" process and the "super-planar" process, were designed to accommodate a metal deposition process in which deposition requires line-of-sight, or near line-of-sight, to a material source. Examples of such processes include evaporation sources and sputter sources. However, other approaches, including chemical deposition, electrochemical deposition, and autocatalytic deposition, do not have a directional source, and thus deposition can take place, for example, under "overhangs".

Consider, for example, a device where semiconductor exists in the entire active area. Then, using the gate as a mask, the source/drain regions can be "tagged" for subsequent etching via a process which sensitizes the existing material to the etch. The semiconductor can then be covered in an insulator and photolithography used to form a contact hole to that semiconductor in the source/drain region, sufficiently far from the gate to accommodate alignment and capacitance tolerances. The "tagged" semiconductor can then be etched away, leaving a recess self-aligned to the gate, to the plane(s) of the channel, and to the active area edge. This recess can subsequently be filled with metal, forming a self-aligned source/drain.

Silicon can be tagged in several ways. These include doping (subsequently etching with a doping-sensitive etch), alloying (for example, with Ge implantation) allowing for an alloy-dependent etch, porosity (the increased surface area of porous silicon allows it to be etched much faster than non-porous silicon), chemical conversion (such as oxidation or silicidation), and disruption of crystallinity (for example amorphization via Si implantation).

The exemplary process described below uses silicidation to form self-aligned metal source/drains to an SOI FinFET (a transistor with channels on opposite sides of a thin fin, each perpendicular to the wafer surface). An application of this approach to a planar SOI MOSFET, with a single channel parallel to the wafer surface, is also described. In each case, additional process steps must precede and succeed those listed here to form a complete electrical device, however, those steps are not included so as not to unnecessarily obscure the description of the present invention.

C2. FinFET (Non-Planar MOSFET)

Figure 14A:
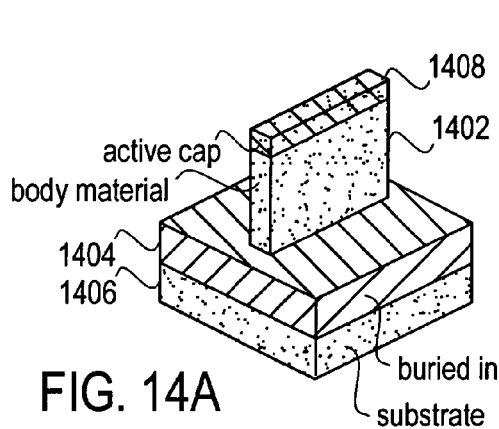
FIGS. 14a-14f illustrate the various views of the fabrication of a FinFET in accordance with an embodiment of the present invention.
Figure 14B:
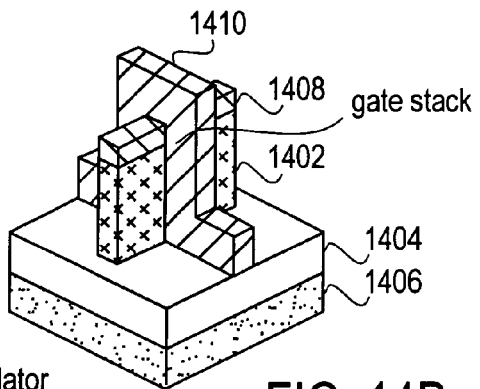

Refer now to FIGS. 14a-14f. FIG. 14a shows a fin 1402 of body material formed on a buried insulator 1404 (itself disposed on a substrate 1406), with a $Si_3N_4$ cap 1408. A gate stack 1410 (see FIG. 14b), for example, a gate insulator, gate electrode and a $Si_3N_4$ cap, is formed over the fin 1402. Sidewall spacers are then formed on the gate 1410, without having them form on the body silicon 1402. This can be done using a gate stack that is tall relative to the silicon fin. See J. Kedzierski et al., *Extension and source/drain design for high-performance FinFET devices*, IEEE Trans. Electron Devices, v. 50, no. 4, pp. 952-958 (2003).

Figure 14C:
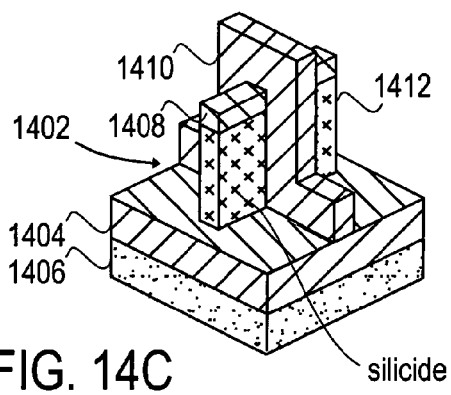

Optionally, the exposed Si (in the S/D regions) may be partially etched to account for volume expansion of the source/drain during the following silicidation reaction. As shown in FIG. 14c, a metal, such as Pd, is deposited and reacted with the Si fin 1402 (e.g., via heating), forming a "dummy" source/drain 1412. Any unreacted metal may then be etched away.

Figure 14D:
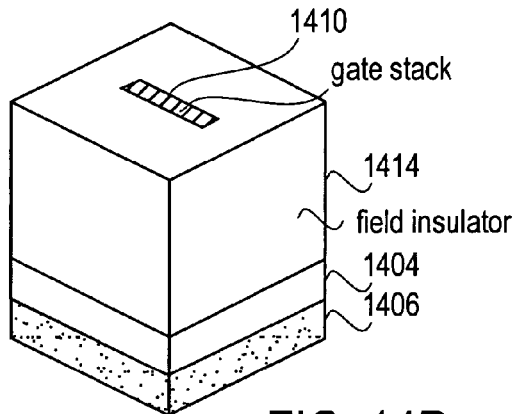

Once this dummy structure has been formed, it is encapsulated in an insulator 1414 such as deposited $SiO_2$. As shown in FIG. 14d, this encapsulations layer may be planarized to approximately the top of the gate 1410.

Figure 14E:
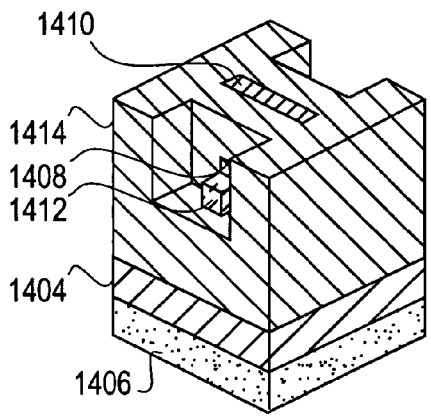
Figure 14F:
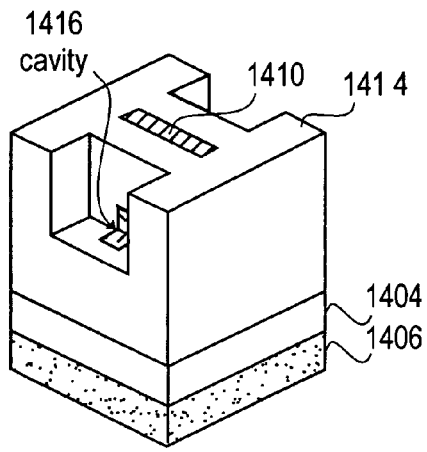

Following the encapsulation, and as shown in FIG. 14e, contact holes are patterned, and the underlying insulator ($SiO_2$ in this example) and the exposed $Si_3N_4$ cap are etched away, exposing some of the dummy source/drain silicide 1412. That exposed portion of the dummy source/drain silicide 1412 may then be etched, creating a cavity 1416 (see FIG. 14f) for the deposited source/drain metal.

Referring now to FIG. 15a, a cut-away view of the partially completed FinFET, showing the cavity 1416, is presented. If desired at this stage, surface passivation may be applied, and then, as shown in FIG. 15b, a low-workfunction metal (n-channel FETs) or a high-workfunction metal (p-channel FETs) 1418 deposited. Possible approaches for this procedure include chemical vapor deposition, autocatalytic deposition and, in alternate embodiments, electrolytic deposition. An anisotropic etch can then be done to confine the metal 1418 to the protected region of the cavity 1416. Finally, a highly conducting "contact metal" 1420, such as W or Al, may be deposited and planarized to the top of the contact holes 1422. FIG. 15c illustrates the completed structure.

C3. Planar SOI FET

An example of a sacrificial source/drain process for planar metal source/drain MOSFETs is described with reference to FIGS. 16a-16f, all of which are cross-sectional views taken along a length axis of the device under construction. It is similar to the FinFET process just described. As was the case for that example, process details not critical to the present invention (but which may be needed to complete a commercial device) are not discussed.

Figure 16A:
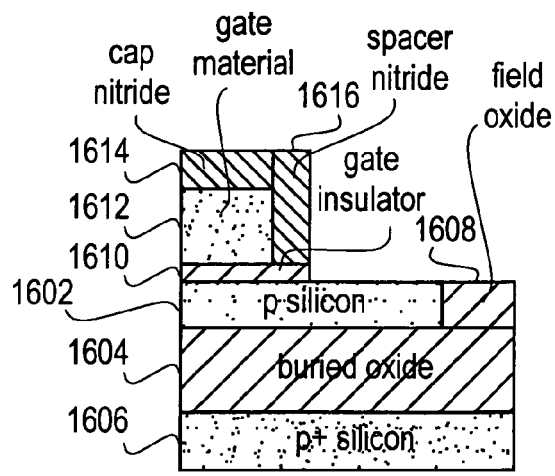

As shown in FIG. 16a, the process begins by using a thin silicon 1602 on $SiO_2$ 1604 on a Si substrate 1606. The wafer is patterned using an "active" mask, etching the Si 1602 from the field regions. In a somewhat idealized fashion, the drawings assume the field region has been filled with a "field oxide" 1608, for example deposited-and-planarized $SiO_2$, although the process may also proceed without this step. A gate insulator 1610, for example $SiO_xN_y$, is formed, as is gate electrode material 1612. Theis material may be, for example, doped polycrystalline Si. The doping may be applied either during deposition, or, more conventional for a "complementary" process, via the patterned ion implantions of appropriate acceptors (such as B) and donors (such as P or As). The gate electrode material should preferably be "capped" with a hard material 1614 such as $Si_3N_4$.

The gate electrode 1612 is patterned, etching any exposed cap, then the gate electrode, to the underlying gate insulator 1610. Any remaining photoresist is removed, and then $Si_3N_4$ "spacers" 1616 are formed on the sides of the gate electrode. The exposed gate insulator 1610 is then etched in the source/drain regions.

Figure 16B:
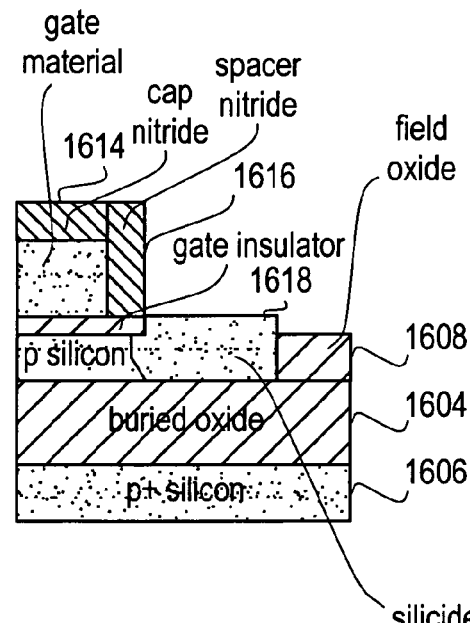

Now referring to FIG. 16b, exposed silicon 1602 in the source/drain regions is converted to a metal silicide 1618. For example, this may be done via the deposition of a metal such as Pd, the limited reaction of the metal sufficient to fully consume the thin silicon under the metal, and the removal of the remaining metal. Optionally, one may partially etch the silicon in the source/drain regions prior to the metal deposition to reduce the thickness of the resulting metal silicide.

Figure 16C:
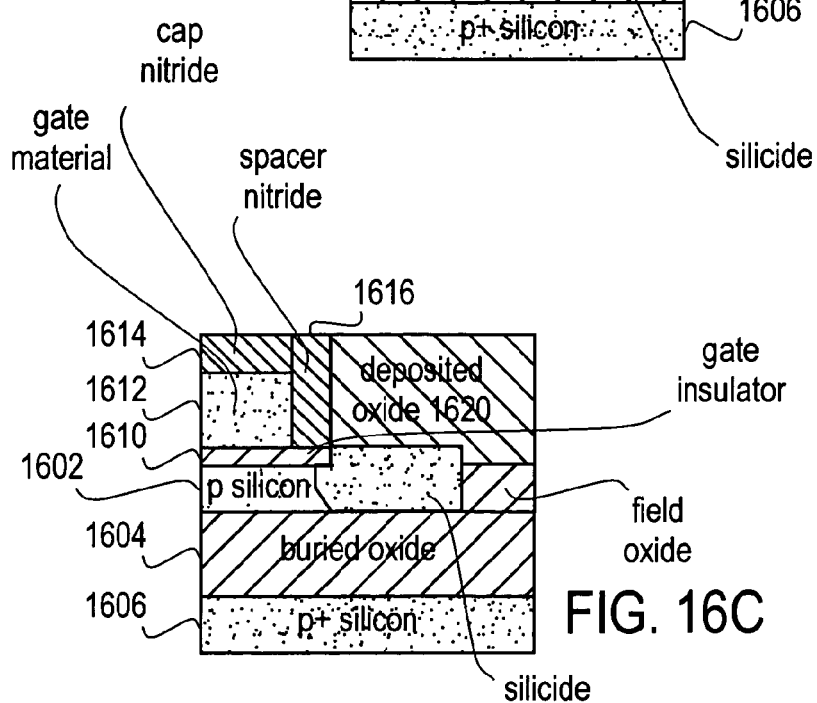

Next, as shown in FIG. 16c, an insulator 1620 (such as $SiO_2$) is deposited and planarized to the top of the gate stack (for example, using the $Si_3N_4$ cap on the gate electrode). Contact holes 1622 to the metal silicide 1618 in the source/drain regions are patterned and etched (see FIG. 16d), and the metal silicide is then etched away forming a recess (cavity) 1624 in the source/drain regions (see FIG. 16e).

Now, referring to FIG. 16f, a source/drain metal 1626 is conformally deposited, for example by chemical or autocatalytic deposition. This source/drain metal 1626 may have a low (n-channel FET) or high (p-channel FET) workfunction, as required. The source/drain metal is etched from regions unprotected by the top of the cavity, and a contact metal 1628, such as Al or W, deposited. Finally, the contact metal may be planarized to the top of the contact holes, leaving the structure shown in the illustration.

D. Complementary MOS (CMOS)

Each of the above examples can be extended to allow for the use of more than one source/drain workfunction, for example for the formation of n-channel FETs and p-channel FETs in the same process. For example, with the sacrificial source/drain process, the contact etch and subsequent metal processing may be performed in multiple stages. In an exemplary CMOS process, one may first form the contact holes for the p-channel FETs, form the p-channel FET source/drain metal, etch the unprotected metal from outside the cavities, then repeat the process with the n-channel FET source/drain metal. The contact metal may then be deposited and planarized to the top of the source/drain contact holes. It may be preferable to deposit and planarize the contact metal after each source/drain metal has been etched, for example once for the p-channel source/drain metal, and once for the n-channel source/drain metal.

With the planar processes, a similar approach can be taken. At the stage where the source/drain metal is deposited, each device type may be processed in turn. For example, one may first perform any n-channel FET passivation, deposit the low-workfunction n-channel FET source/drain metal, deposit a protective cap metal and then pattern a "p-FET select mask" to reveal the p-channel FETs. In exposed regions, the cap metal and the n-channel FET source/drain metal are then etched, and any remaining photoresist removed. Optionally, one may then remove the exposed passivation layer and/or apply a new passivation layer. The p-channel FET source/drain metal may then be deposited, followed by a protective cap metal. The metals are then planarized to the top of the source/drain recesses, and the source/drain regions themselves recessed to reduce source/drain-to-gate capacitances.

Of course, the above sequence is only one of many possible approaches and alternatives are available. One alternative, for example, is to use the present invention for one device type, with an alternate method used for another device type. For example, an n-channel FET may be formed using an embodiment of the present invention subsequent to forming p-channel FETs with PtSi or IrSi "silicide" source/drains.

E. Alternate Embodiments

Selective source/drain deposition: The preceding examples describe processes where a metal is deposited across the entire exposed surface, including recesses in the source/drain regions, and then planarized to the surface of the recess, removing it everywhere except for the source/drain regions. An alternate approach is to "selectively deposit" a conductor so it is formed only in the recess. This deposition may be followed by a subsequent planarization, or may be limited such that the deposition is to the desired thickness. An example of such a procedure is now described with reference to FIGS. 17a-17d.

Figure 17A:
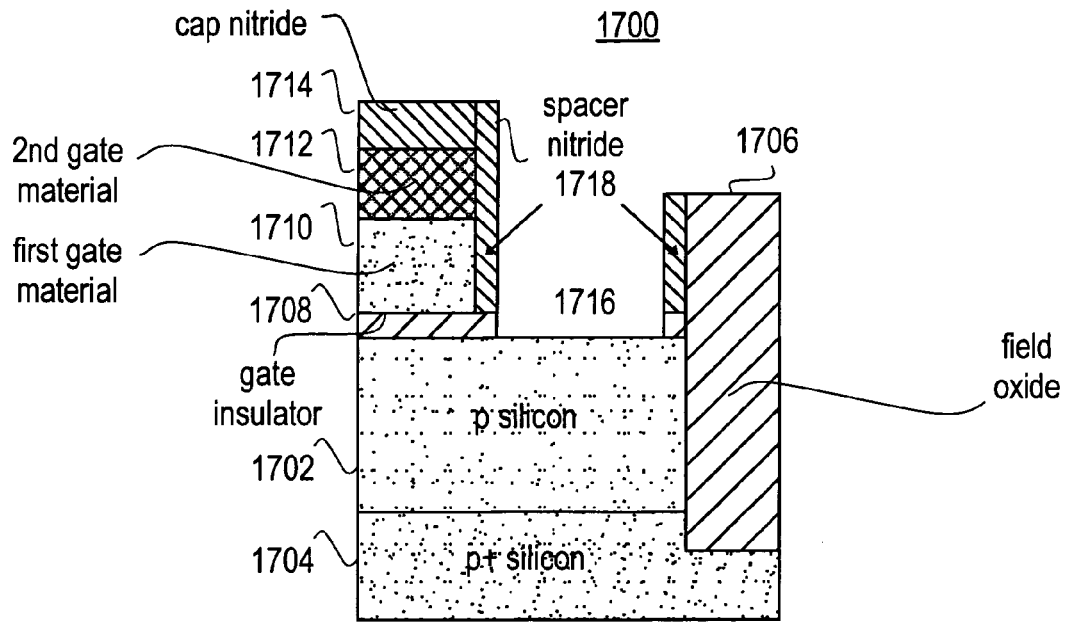
FIGS. 17a-17d illustrate length axis cut away views of a selectively deposited source/drain transistor fabrication process in accordance with an embodiment of the present invention.

Initially, the structure 1700 illustrated in FIG. 17a may be formed using methods similar to those described in the "planar mesa" process above. Distinctions from that process, however, include the use of bulk silicon with deep "wells", i.e., regions of high impurity concentration designed to improve the isolation between source/drain regions. In the present example, p-type silicon 1702 is disposed over impurity-rich p+ silicon 1704. Another difference is the use of $SiO_2$-filled trenches 1706 for isolation. The formation of such wells and the isolation trenches is conventional in the art and will not be described in detail herein. In particular, the formation of the trenches follows in a straightforward fashion from the description of the "planar mesa" process above.

As was the case for the planar mesa process, a gate insulator 1708 is disposed over the silicon 1702 and a gate stack consisting of first gate material 1710, second gate material 1712 and a nitride cap 1714 is formed over the gate insulator. A recess 1716 is formed and nitride spacers 1718 may be formed on the sidewalls of that recess.

Figure 17B:
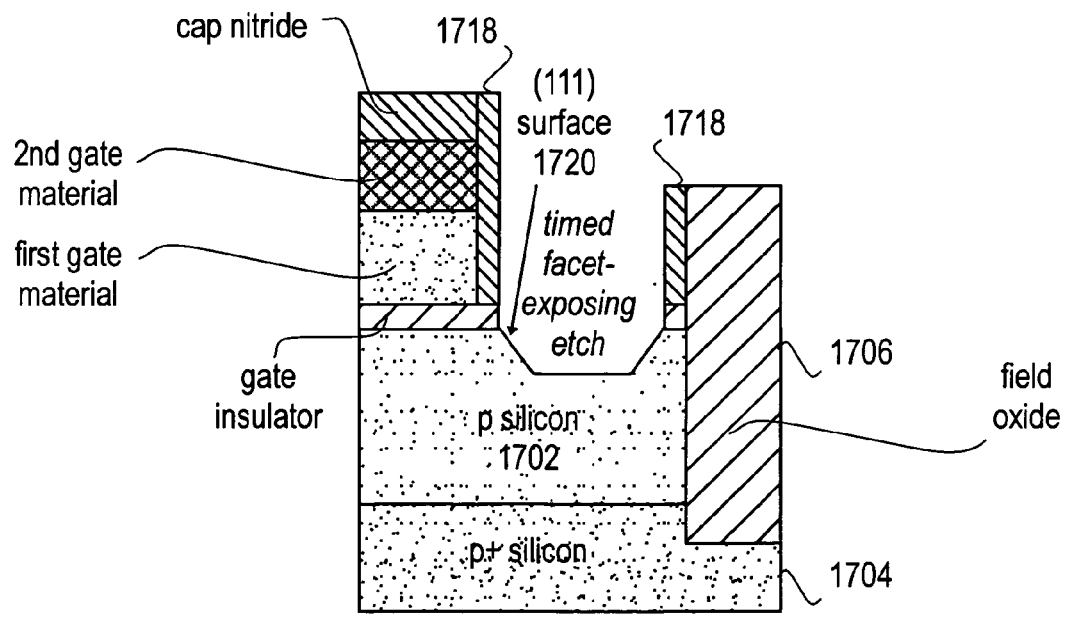

Now referring to FIG. 17b, one may selectively etch into the exposed silicon 1702. The figure suggests the use of a (111)-facet-exposing etch (see, e.g., the exposed (111) surface 1720), such as TMAH, or KOH. However, various etch approaches otherwise known in the art may also be used. This etch may be followed by treatment(s) to improve the crystalline quality of the etched surface, such as "sacrificial oxidation" or inert anneals at elevated temperature.

Figure 17C:
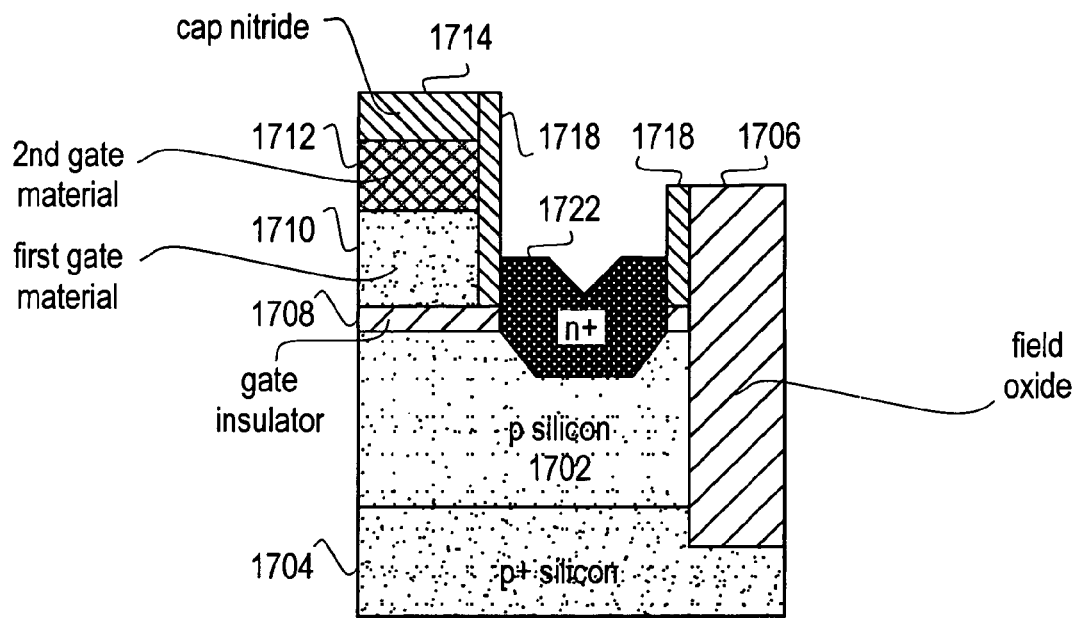
Figure 17D:
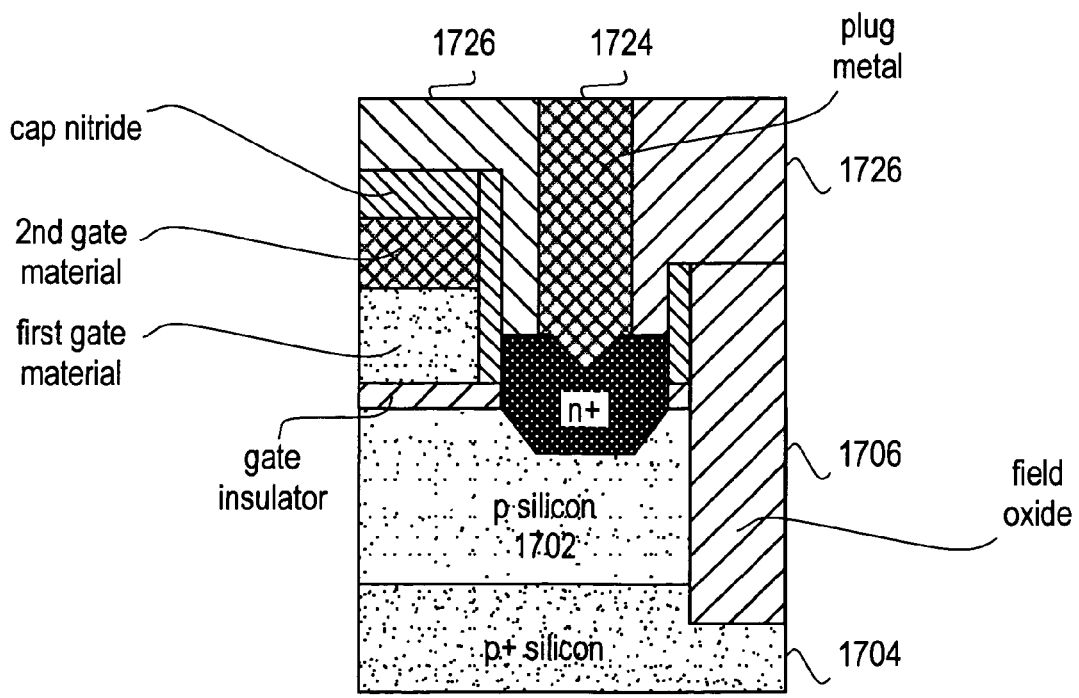

Now turning to FIG. 17c, silicon 1722 (or an alloy of Ge, Si, and/or C) is epitaxially deposited in the etched recesses, in-situ degenerately doped. Thereafter, referring to FIG. 17d, back-end processing, making contacts using a plug metal 1724 disposed in a via through an insulator 1726 to the epitaxial degenerately-doped semiconductor 1722, may be performed.

An alternative approach is electrolytic or autocatalytic deposition of low-workfunction (n-channel FET) or high workfunction (p-channel FET) metals on exposed silicon, for example in place of the epitaxial deposition of silicon in the "selective deposition" process just described. Electrolytic deposition of low-workfunction metals for the formation of gate stacks is described in U.S. Pat. No. 6,300,203 of Buynoski et al. Also, autocatalytic ("electroless") deposition is another means of selectively depositing certain metals on a conducting surface. For example, the "electroless" deposition of Cu for low-resistance metal interconnects in silicon-based technology is described by P. L. Pai and C. H. Ting, *Selective electroless copper for VLSI interconnection*, IEEE Electron Device Letters, v. 10, n 9, pp. 423-425 (1989). Another early example of autocatalytic selective deposition is the electroless deposition of Pd or Ni in contact holes, e.g., as described by C. S. Wei et al., *The use of selective electroless metal deposition for micron size contact fill*, 1988 IEEE International Electron Device Meeting Technical Digest, pp. 446-449 (1988).

Still another option is the sequential deposition of an epitaxial passivation layer followed by the selective deposition of a low-workfunction metal. For example, after exposing (111) Si or (111) $Ge_xSi_yC_{1-x-y}$, one may selectively deposit GaSe or another III-VI material. For example, GaSe can be deposited in a self-limiting fashion such that essentially a single bilayer is formed on (111) Si. This approach is disclosed by Faulkner, et al., *Insulated Gate Field-Effect Transistor Having III-VI Source/Drain Layer(s)*, U.S. patent application Ser. No. 11/010,048, filed Dec. 9, 2004, assigned to the assignee of the present invention and incorporated herein by reference. Assuming the silicon had been etched to expose (111) facets, this process could be used in either or both of the "planar mesa" process and/or the "super-planar" process.

Thus, processes for forming self-aligned, deposited source/drain, insulated gate, transistors and, in particular, FETs have been described. Although discussed with reference to various examples, however, the present invention should only be measured in terms of the following claims.

What is claimed is:

1. A method, comprising:
forming a gate structure of a transistor on a surface of a semiconductor substrate, wherein the gate structure extends beyond a channel region;
creating, with a self-aligned process, a recess in the semiconductor substrate aligned to an edge of the gate structure and additionally aligned with and directly adjacent to an edge of a channel of the transistor at a border with a field region; and
subsequently depositing, in the recess, a metal source/drain material, wherein the metal source/drain material is directly adjacent to a channel region, thereby forming a direct electrical contact to the channel region.

2. The method of claim 1, wherein the source/drain conducting material is deposited in one or more layers.

3. The method of claim 2, wherein at least one of the one or more layers is planarized such that portions of the at least one of the one or more layers which extend beyond the recess are removed.

4. The method of claim 1, wherein the source/drain conducting material is deposited in the recess via selective deposition on one or more surfaces within the recess.

5. The method of claim 4, wherein prior to deposition of the source/drain conducting material, one or more passivation layers are formed on one or more surfaces within the recess.

6. The method of claim 1, wherein the source/drain conducting material is deposited in the recess via selective electrolytic deposition on one or more surfaces within the recess.

7. The method of claim 1, wherein prior to depositing the source/drain conducting material, one or more additional materials are first deposited in the recess and then anodized to form a passivation layer.

8. The method of claim 7, wherein the one or more additional materials are deposited by selective electrolytic deposition on one or more surfaces within the recess.

9. The method of claim 8, wherein following anodization of the one or more additional materials, the source/drain conducting material is deposited by further selective electrolytic deposition.

10. The method of claim 1, wherein the source/drain conducting material is deposited in the recess via autocatalytic deposition.

11. The method of claim 1, wherein the source/drain conducting material is deposited in combination with one or more non-conducting materials.

12. A method, comprising:
forming a first structure which defines a gate region of a field-effect transistor (FET), the first structure formed on a semiconductor region which will constitute a body region of the FET;
sensitizing semiconductor material proximate to the first structure but not covered by the first structure to produce sensitized semiconductor material,
covering the sensitized semiconductor material with an insulator
removing a portion of the insulator, exposing a first portion of the sensitized semiconductor material and leaving a second portion of the sensitized semiconductor material covered with the insulator;
selectively removing substantially all of the sensitized semiconductor material, creating a recess with an overhang of insulator; and
depositing a metal in the recess to form a metal source/drain, said metal source/drain at least partly covered by said overhang of insulator.

13. The method of claim 12, further comprising removing a portion of said metal source/drain not covered by said overhang of insulator.

14. The method of claim 12, wherein the first structure includes a conducting gate electrode material.

15. The method of claim 14, wherein the first structure further includes insulating spacers on sides of the gate electrode material, electrically insulating the gate electrode material.

16. The method of claim 12, wherein the semiconductor material proximate to the first structure but not covered by the first structure is sensitized by chemical reaction.

17. The method of claim 16, wherein the semiconductor material proximate to the first structure but not covered by the first structure is sensitized by reacting it with a metal, and further comprising removing unreacted metal, leaving a reaction product.

18. The method of claim 12, wherein the semiconductor material proximate to the first structure but not covered by the first structure is sensitized by incorporation of ionized impurities, and further comprising etching the semiconductor material proximate to the first structure but not covered by the first structure using an etch sensitive to concentrations of ionized impurities such that portions of the material into which the ionized impurities were incorporated are preferentially removed.

19. The method of claim 12, wherein the semiconductor material proximate to the first structure but not covered by the first structure is sensitized by incorporation of another material to form an alloy, and further comprising etching the alloy.

20. The method of claim 12, wherein the semiconductor material proximate to the first structure but not covered by the first structure is sensitized by an electrochemical process.

21. The method of claim 12, wherein the semiconductor material proximate to the first structure but not covered by the first structure is made to be porous, and further comprising etching the porous material.

22. The method of claim 12, wherein the semiconductor material proximate to the first structure but not covered by the first structure has a crystalline structure, and further comprising disrupting the crystalline structure by exposure of the semiconductor material proximate to the first structure but not covered by the first structure to bombardment with energetic ions, and etching the material of sufficiently disrupted crystalline structure.

23. The method of claim 12, wherein the selective removal of the sensitized semiconductor material exposes an insulating layer.

24. The method of claim 23, wherein the insulating layer is primarily $SiO_2$.

25. A method of forming a transistor, comprising:
forming a first material stack including a semiconductor, capped with a second material stack, the first and second material stacks each covering both an active region of the transistor and a region where a gate conductor of the transistor will extend over a field, forming a field insulator in a region not covered by the first and second material stacks, removing the second material stack from a first region of the gate conductor, which includes a channel region of the transistor, and a region where the gate conductor extends within a field region, forming a gate stack in the first region from which the second material stack was removed, removing remaining portions of the second material stack, forming a recess, depositing a metal source/drain in the recess.

26. The method of claim 25, wherein the second material stack includes a compound of silicon and nitrogen.

27. The method of claim 26, wherein the field insulator includes $SiO_2$.

28. The method of claim 27, wherein the field insulator is planarized to a level of the compound of silicon and nitrogen.

29. The method of claim 28, wherein planarization includes chemo-mechanical polishing.

30. The method of claim 29, wherein the gate stack is formed by forming an insulating layer on exposed semiconductor of the first material stack, depositing a conducting material, and planarizing a resulting structure to remove the conducting material from a surface of a field insulator.

31. The method of claim 30, wherein planarizing the resulting structure includes chemo-mechanical polishing.

32. The method of claim 31, wherein the chemo-mechanical polishing is terminated during contact to the compound of silicon and nitrogen in the second material stack.

33. The method of claim 25, wherein exposed semiconductor from the first material stack is removed prior to depositing the metal source/drain.

34. The method of claim 25, wherein the metal source/drain is selectively deposited such that it is formed on material from the first material stack, but not formed elsewhere.

35. The method of claim 25, wherein the metal source/drain is deposited, then removed from regions beyond the recess.

36. The method of claim 35, wherein the removal includes polishing.

37. The method of claim 25, wherein prior to depositing the metal source/drain, a passivation layer is formed on exposed semiconductor.

* * * * *